(12) United States Patent
Maeno

(10) Patent No.: US 6,229,741 B1
(45) Date of Patent: May 8, 2001

(54) SEMICONDUCTOR INTEGRATED CIRCUIT DEVICE

(75) Inventor: Hideshi Maeno, Tokyo (JP)

(73) Assignee: Mitsubishi Denki Kabushiki Kaisha Chiyoda-Ku, Tokyo (JP)

( * ) Notice: Subject to any disclaimer, the term of this patent is extended or adjusted under 35 U.S.C. 154(b) by 0 days.

(21) Appl. No.: 09/440,055

(22) Filed: Nov. 15, 1999

(30) Foreign Application Priority Data

Jun. 21, 1999 (JP) .................................................. 11-174002

(51) Int. Cl.[7] ....................................................... G11C 7/00
(52) U.S. Cl. ............................................. 365/200; 365/201
(58) Field of Search ..................................... 365/200, 201

(56) References Cited

U.S. PATENT DOCUMENTS 5,815,512   9/1998   Osawa et al. .
5,987,623 * 11/1999   Ushida .................................. 365/201

FOREIGN PATENT DOCUMENTS 8-83496   3/1996   (JP) .

* cited by examiner

*Primary Examiner*—Richard Elms
*Assistant Examiner*—VanThu Nguyen
(74) *Attorney, Agent, or Firm*—Burns, Doane, Swecker & Mathis, LLP

(57) ABSTRACT

A semiconductor integrated circuit device has a RAM (1) which has a plurality of memory cell groups containing memory cells of a number corresponding to the number of words used, and a RAM (30, 40, 50, or 60) as a redundant circuit which has memory cell group containing memory cells of a number corresponding to the number of words of the RAM (1). Either one of data from the RAM (1) and data from the RAM (30, 40, 50, or 60) is selected by a selector circuit (5) to use the latter as a redundant circuit.

7 Claims, 20 Drawing Sheets

SEMICONDUCTOR INTEGRATED CIRCUIT DEVICE

BACKGROUND OF THE INVENTION

1. Field of the Invention

The present invention relates to a semiconductor integrated circuit device provided with a test circuit and a redundant circuit for a memory circuit section.

2. Description of the Related Art

A conventional test circuit and redundant circuit for a storage circuit portion in a semiconductor integrated circuit device is disclosed, for instance, in a U.S. Patent document U.S. Pat. No. 5,815,512 (corresponding to a Japanese laid open publication No. JP-A-8/94718).

FIG. 1 is a circuit diagram depicting a conventional scan flip-flop (SFF) for testing a memory circuit such as a RAM (a Random Access Memory). In FIG. 1, Reference numeral 211 designates a scan flip-flop and 212 denotes a comparator incorporated therein. The comparator 212 compares the output from the RAM as the memory circuit with an expected value and then outputs a comparison result. Reference numeral 213 denotes a flip-flop (FF) for holding the comparison result provided from the comparator 212.

FIG. 2 is a block diagram showing a memory circuit such as a RAM equipped with a conventional test circuit. In FIG. 22, Reference numeral 221 designates the RAM as a memory circuit, and 211 denotes four denotes flip-flops, which are connected in series to form a scan path for testing the RAM 221. The scan flip-flops 211 are each identical in construction to that depicted in FIG. 21.

Next, a description will be given of the operation of the RAM 221 equipped with the conventional test circuit.

The RAM 221 equipped with the conventional test circuit, depicted in FIG. 22, provides data output signals DO<0>, DO<1>, DO<2> and DO<3> of four bits to the scan flip-flops 211 forming the scan paths respectively corresponding thereto.

The RAM 221 is tested following the procedure described below.

First, the procedure begins with setting control signals TM and SM at 0 and 1, respectively (TM=0 and SM=1), prior to the start of the test. Then a signal SIDO=1 is input into the uppermost scan flip-flop 211.

The prior art example shown in FIG. 2 has the four series-connected scan flip-flops 211, and hence it requires four clocks to set the value 1 in all of them. Accordingly, the scan flip-flops 211 output signals SO<0>=1, SO<1>=1, SO<2>=1, and SO<3>=1, respectively.

The next step is to set the control signals TM and SM both at 1 (TM=1 and SM=1). This is followed by testing the RAM 221 at every address. That is, the test is carried out by writing test data in and reading out of the RAM 221 while at the same time appropriately controlling an expected value EXP and a comparison control signal CMP (which indicates a comparison when it is 1).

If there is a defect in the RAM 221, the output DO<> from the RAM 221 differs from the expected value EXP, and the output from a comparator (212 in FIG. 21) in the corresponding scan flip-flop 211 goes to zero, and this scan flip-flop 211 is reset to 0 in synchronization with the clock signal T.

For instance, when a fault is detected in the scan flip-flop 211 (SFF<2>) corresponding to the output DO<2> from the RAM 221, the output signal SO<2> from that scan flip-flop goes to 0. The output signals from the other scan flip-flops, however, remain unchanged, i.e. SO<0>=1, SO<1>=1, and SO<3>=1.

Next, the control signals TM and SM are set at 0 and 1, respectively (TM=0 and SM=1), followed by shifting out the test results SODO<0> from the last-stage scan flip-flop 211.

FIG.3 is a block diagram showing a conventional memory circuit such as a RAM equipped with a test circuit and a redundant circuit. In FIG. 3, Reference numeral 231 designates a RAM provided with the test circuit shown in FIG. 2, 232 denotes a redundant circuit, and 233 denotes a register for temporarily storing the outputs from the scan flip-flops.

In the configuration shown in FIG. 3, the redundant circuit 232 is incorporated in the RAM with the test circuit shown in FIG. 2. For example, when a failure is detected based on the output SFF<2> from the scan flip-flop corresponding to the output DO<2> from the RAM as a memory circuit, the signal SO<2> goes to 0 (SO<2>=0). On the other hand, the outputs SO<0> SO<1> and SO<3> from the other scan flip-flops each remain at 1 (SO<0>=1 SO<1>=1, and SO<3>=1).

When the register 233 stores these signals SO<> are, the signals G<1>=1, G<2>=0 and G<3>=1 are provided, and these signals G<> become F<3>=1, F<2>=0 and F<1>=0, respectively. As a result, signals DO<3>/Q<3>, DO<1>/Q<1> and DO<0>/Q<0> are transferred as signals XDO<2>, XDO<1> and XDO<0>, respectively, and the signal DO<2> provided from the failing portion in the RAM 231 is not transferred to the outside. Similarly, input data signals XDI<2>, XDI<1>, and XDI<0> from the outside are transferred to the RAM 231 as signals DI<3>, DI<2>, DI<1>, and DI<0> shown in FIG. 3.

Based on the switching operation for switching the output from the defective memory cell to the output from the redundant circuit described above, the normal operation of a 3-bit input/output RAM can be performed correctly even if there is a fault of a memory circuit in the RAM 231 corresponding to the signal DO<2>. However, there is a drawback that it is difficult to repair defective memory cells if the data output signals DO<> indicate that the RAM includes two or more defective bits.

Because of such a configuration as described above, the conventional semiconductor integrated circuit device equipped with the test circuit and the redundant circuit has, for its data input/output (data I/O), an additional memory cell corresponding to one bit for self-repairing use. That is, it is necessary to use a RAM that has an extra memory cell corresponding to the one-bit input/output. Hence, this technique cannot be applied to the semiconductor integrated circuit device once the RAM layout design is completed. Its application requires a redesign of the RAM and hence takes much time. The prior art has another problem that the incorporation of the redundant circuit inevitably increases the number of memory cells corresponding to the number of words of the RAM involved.

SUMMARY OF THE INVENTION

It is therefore an object of the present invention to provide a semiconductor integrated circuit device equipped with a test circuit and a redundant circuit wherein the redundant circuit for redundant bits is formed by using another RAM that is not a RAM as a memory circuit, thereby making unnecessary design changes in the layout of the RAM forming the memory circuit in the semiconductor integrated circuit device.

A further object of the present invention is to provide a semiconductor integrated circuit permitting reduction of the number of memory cells for the redundant circuit.

In accordance with one aspect of the present invention, a semiconductor integrated circuit device has a first memory circuit, a second memory circuit, and a redundancy control circuit. The first memory circuit has an address decoder and at least first and second memory cell groups, each memory cell group includes memory cells of a number corresponding to the number of words, and which outputs first and second data from the first and second memory cell groups. The second memory circuit has an address decoder and a third memory cell group including memory cells of a number smaller than or equal to the number of words of the first memory circuit and outputs third data from said third memory cell group. The redundancy control circuit has a first selector circuit for selecting either one of the first and second data output from the first memory circuit, and a second selector circuit for selecting either one of the first data and the third data output from the second memory circuit.

In accordance with a further aspect of this embodiment, the third memory cell group in the second memory circuit includes memory cells of a number corresponding to the number of words of the first memory circuit.

In accordance with another aspect of the present invention, the number of words of the first memory circuit is an integral multiple of the number of memory cells contained in the third memory cells in the second memory circuit.

In accordance with another aspect of the present invention, the semiconductor integrated circuit device further has a comparator circuit and a scan path circuit. The comparator circuit compares the first, second and third data output from the first and second memory circuits with expected values, and for outputting the comparison results. The scan path circuit has a plurality of scan flip flops for serially shifting out the comparison results provided from the comparator circuit.

According to another aspect of the present invention, the first memory circuit is a cell-based RAM and the second memory circuit is a gate-array RAM.

In accordance with a further aspect of the present invention, the memory cells in the first memory circuit are each a memory cell of a single-port RAM, and the memory cells in the second memory circuit are each a memory cells of a multi-port RAM.

In accordance with another aspect of the present invention, the semiconductor integrated circuit device further has an output register for storing the first, second and third data outputs from the first memory circuit and the second memory circuit.

BRIEF DESCRIPTION OF THE DRAWINGS

Other objects, features and advantages of the present invention will become apparent from the following description taken in conjunction with the accompanying drawings, in which.

DETAILED DESCRIPTION OF THE PREFERRED EMBODIMENTS

A detailed description will be given, with reference to the accompanying drawings, of the preferred embodiments of the present invention.

First Embodiment

Figure 4:
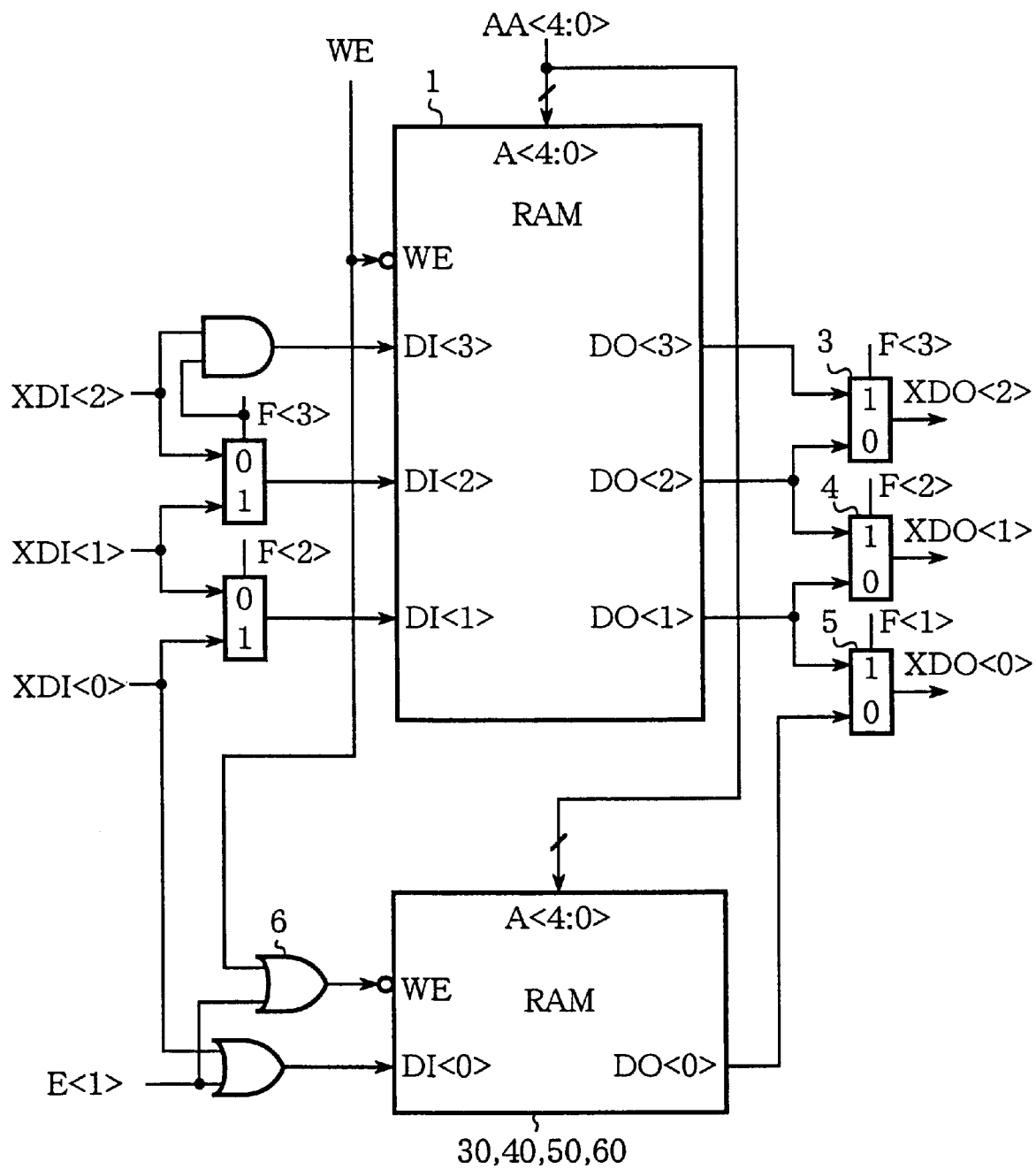
FIG. 4 is a circuit diagram illustrating a semiconductor integrated circuit device according to a first embodiment of the present invention.

FIG. 4 is a circuit diagram showing a semiconductor integrated circuit device according to the first embodiment of the present invention. In FIG. 4, Reference numeral 1 designates a RAM which includes a test circuit. Reference numerals 30, 40, 50 and 60 denote a RAM to be used as a redundant circuit that is incorporated in the semiconductor integrated circuit device independently of the RAM 1. Reference numeral 3 denotes a selector circuit, 4 a selector circuit, 5 a selector circuit, and 6 an OR circuit. A redundancy control circuit for controlling the operations of the redundant circuits 30, 40, 50 and 60 and the RAM 1 comprises the three selector circuits 3, 4 and 5. Reference characters F<1>, F<2> and F<3> indicate signals which are provided, based on test results, from the RAM 1 to the selector circuits 3, 4 and 5 that is a part of the redundant circuit.

Figure 5:
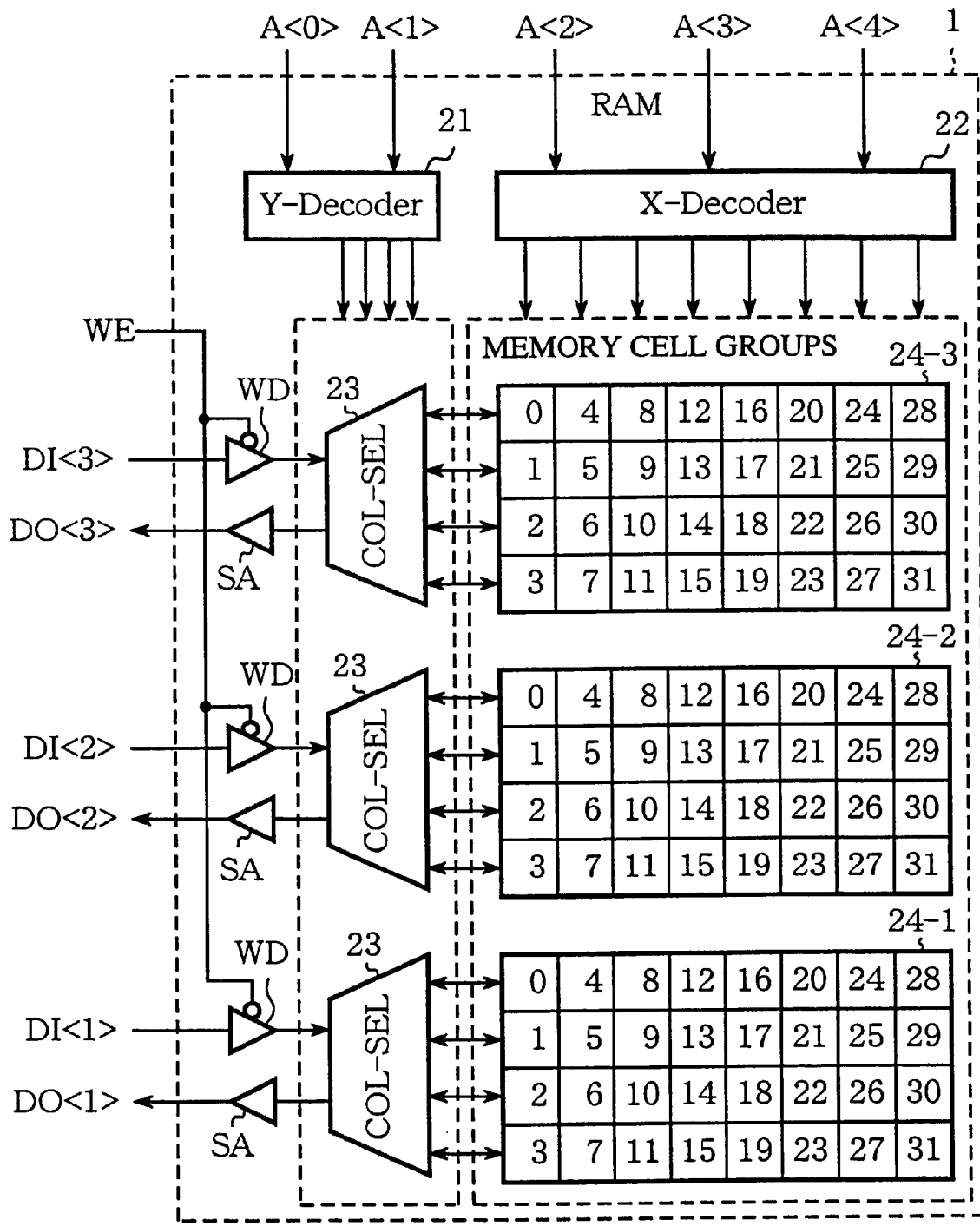
FIG. 5 is a circuit diagram depicting a RAM incorporated in the semiconductor integrated circuit device shown in FIG. 4.

FIG. 5 is a circuit diagram showing the RAM 1 having a memory configuration of 32 words×3 bits in the semiconductor integrated circuit device shown in FIG. 4. In FIG. 5, Reference character WD designates each of write drivers and SA each of sense amplifiers. The write drivers WD perform based on the write enable signal WE. Reference numeral 21 denotes an address decoder (a column decoder), 22 an address decoder (a row decoder) and 23 column selectors. Reference numerals 24-1, 24-2 and 24-3 denote memory cell groups, each group of three memory cells consists of one word. Accordingly, the RAM 1 shown in FIG. 5 is a RAM of 32 words×3 bits.

In the memory cell groups 24-1, 24-2 and 24-3 in the RAM 1, the numbers 0 through 31 attached to the respective memory cells are their addresses. FIG. 5 shows the configuration in which the number of columns per data I/O bit (hereinafter referred to as CPB (Column per bit)) is 4 (CPB=4).

FIGS. 6, 7, 8 and 9 are circuit diagrams showing various possible configurations of the RAM as the redundant circuit shown in FIG. 4. In FIGS. 6, 7, 8, and 9, Reference numerals 30, 40, 50 and 60 denote redundant circuits corresponding to the RAMs 30, 40, 50 and 60 in FIG. 4, respectively. Reference numbers 31, 41 and 51 designate address decoders (column decoders), 32, 42 and 52 denote address decoders (row decoders), 33, 43 and 53 indicate column selectors, and 34, 44, 54 and 65 designate memory cell groups. The numbers 0 through 31 attached to the respective cells of the memory cell groups 34, 44, 54 and 64 indicate addresses assigned to the individual memory cells.

Figure 6:
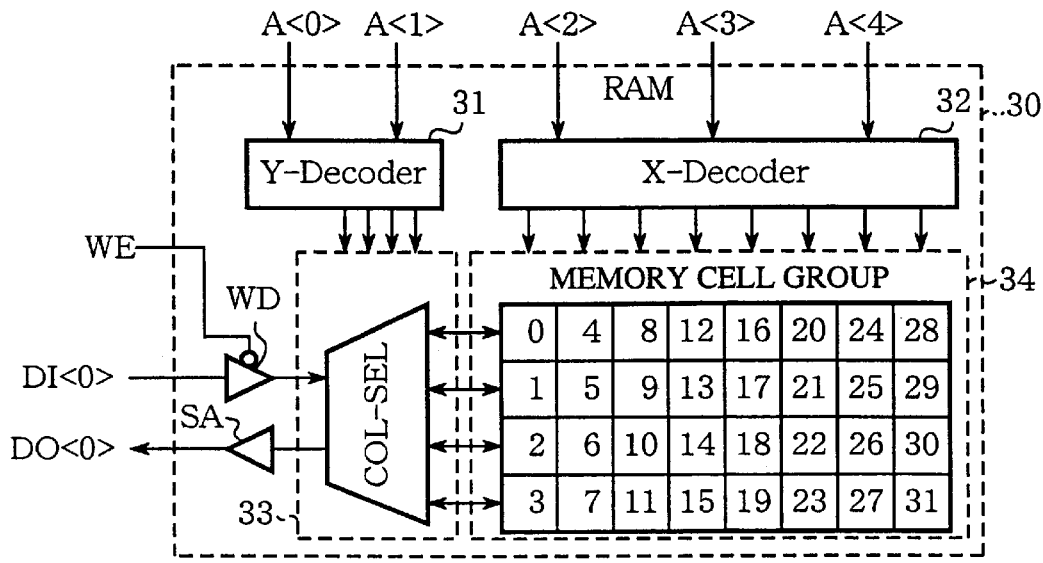
FIG. 6 is a circuit diagram depicting a configuration of a redundant circuit incorporated in the semiconductor integrated circuit device shown in FIG. 4.
Figure 7:
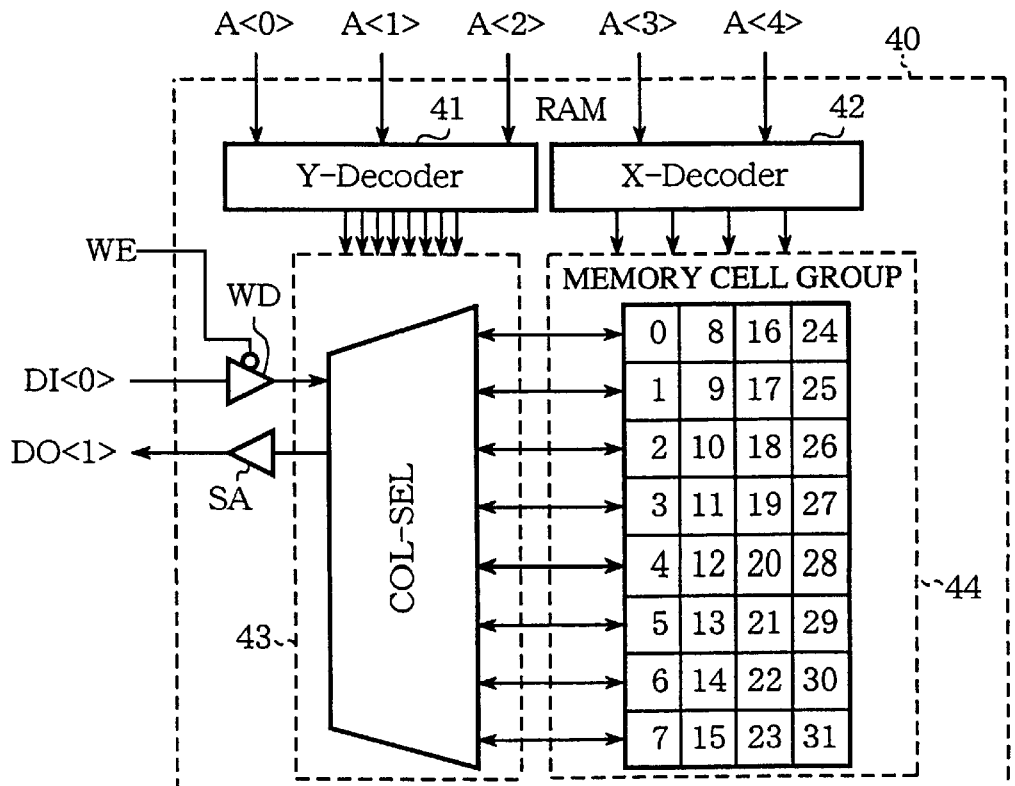
FIG. 7 is a circuit diagram depicting another configuration of the redundant circuit in the semiconductor integrated circuit device shown in FIG. 4.
Figure 8:
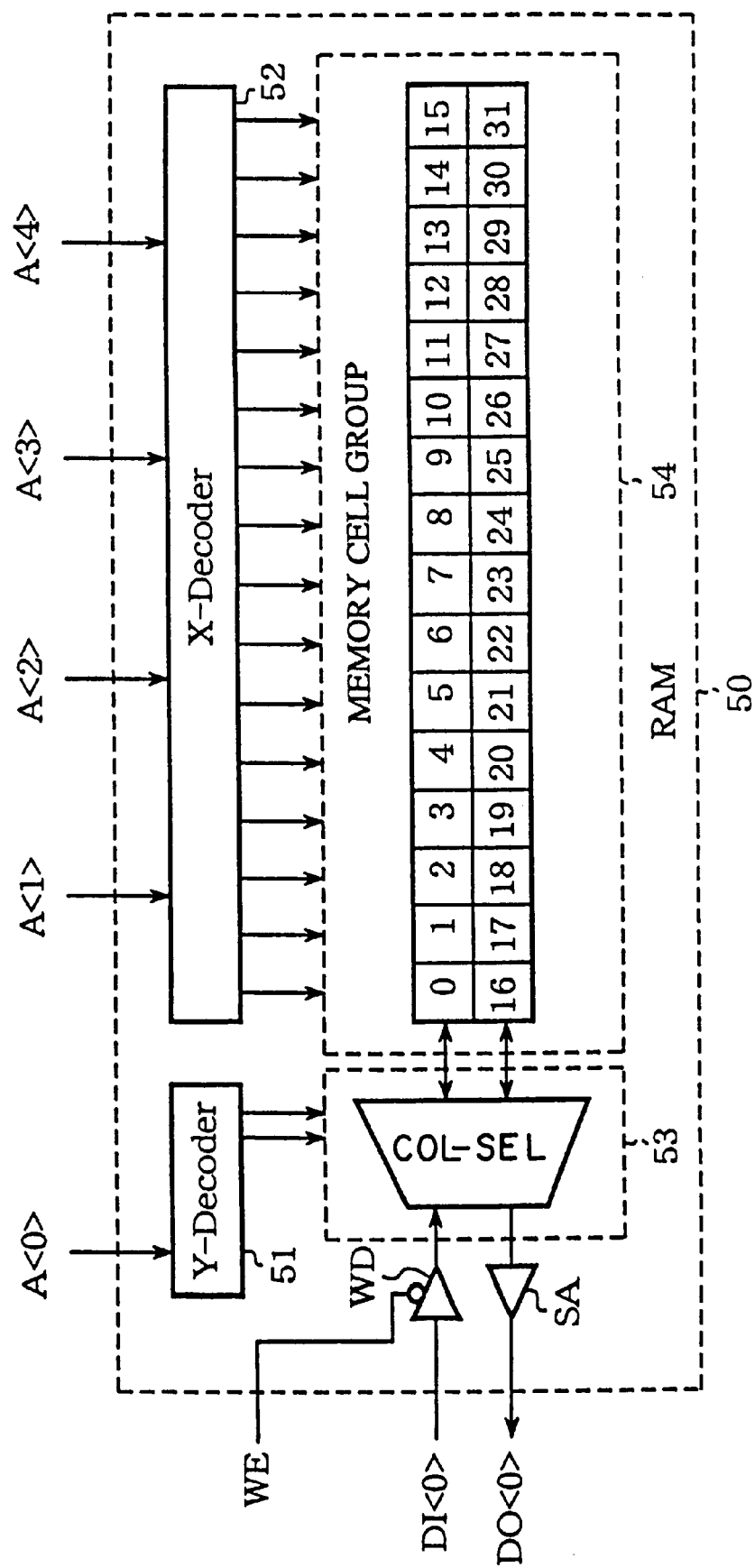
FIG. 8 is a circuit diagram depicting another configuration of the redundant circuit in the semiconductor integrated circuit device shown in FIG. 4.
Figure 9:
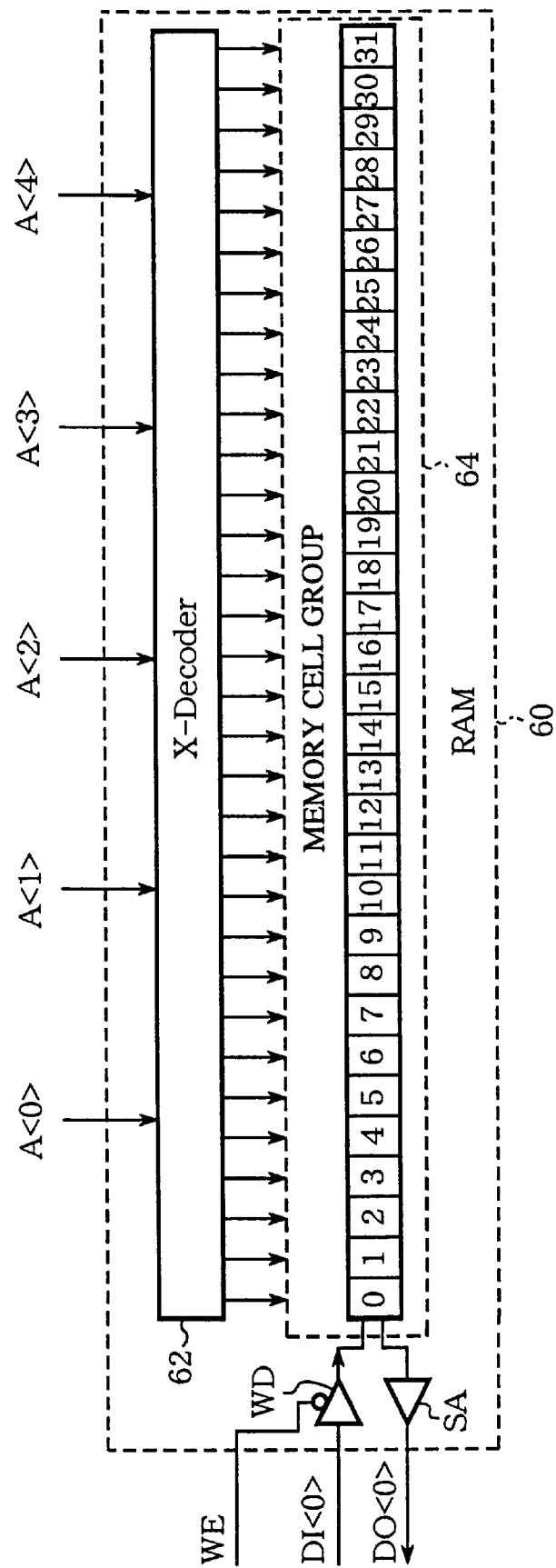
FIG. 9 is a circuit diagram depicting still another configuration of the redundant circuit in the semiconductor integrated circuit device shown in FIG. 4.

The circuit diagram of the RAM 30 shown in FIG. 6 indicates a case of CPB=4, the circuit diagram of the RAM 40 shown in FIG. 7 a case of CPB=8, the circuit diagram of the RAM 50 shown in FIG. 8 a case of CPB=2, and the circuit diagram of the RAM 60 shown in FIG. 9 a case of CPB=1.

Any of the RAMs 30, 40, 50 and 60 shown in FIGS. 6, 7, 8, and 9 are applicable to the RAM as the redundant circuit shown in FIG. 4. Furthermore, memory circuits of other configurations than those of FIGS. 3 to 6 but logically equivalent thereto can each be incorporated as a redundant circuit in the semiconductor integrated circuit device shown in FIG. 4.

Next, a description will be given of the operation of the first embodiment.

As shown in FIG. 4, the RAM 1 is one that has a desired number of data I/O bits, and the RAMs 30, 40, 40 and 60 are each a RAM corresponding to redundant bits. Test data XDI<0:2> are inputted into the RAM 1, from which the signals F<3>, F<2> and F<1> based on the test results are provided to the selector circuits 3, 4 and 5 which form the redundancy control circuit.

For example, when the signal F<1> indicates a bit failure, the selector circuit 5 responds thereto to select the output data DO<0> from the RAM 30, 40, 50, or 60 and provides it as an output signal XDO<0> to the outside.

A write enable signal WE for the RAM 1 as the memory circuit and a write enable signal WE for the RAM 30, 40, 50, or 60 as the redundant circuit are used commonly. That is to say, when the signal lines for the control signals WE for both the RAM 1 and the RAM 30, 40, 50, or 60 are connected, it is possible to eliminate the OR circuit 6 that outputs the signal WE for the RAM 30, 40, 50, or 60. However, it is possible to suppress the write operation to the RAM 30, 40, 50, or 60 by using the OR circuit 6 when the RAM 1 has no defective section and hence cut power consumption of the semiconductor integrated circuit device.

As described above, even after the completion of the layout design of the RAM 1, it is possible to form the semiconductor integrated circuit device logically having a redundant circuit by additionally designing the layout of the RAM 30, 40, 50, or 60 into the layout design of the semiconductor integrated circuit device.

Incidentally, when there is a gate array library including gate arrays for use as logic circuits for designing the semiconductor integrated circuit device, circuits other than the RAM 1, such as the RAM 30, 40, 50, or 60 and the selector circuits 3, 4 and 5 which constitute the redundancy control circuit, can also be formed by using these gate arrays. In this case, it is possible to determine whether the redundant circuit is necessary or not in a wiring step in the manufacturing process for the integrated circuit device. When the manufacturing process has matured and the production yield thereby improves, the RAM 30, 40, 50, or 60 as the redundant circuit and the selector circuits 3, 4 and 5 will become unnecessary for the semiconductor integrated circuit device.

Accordingly, when the RAM 30, 40, 50, or 60 as the redundant circuit and the selector circuits 3, 4 and 5 are formed by using gate arrays, they can be used for the purpose of extending the function of a desired logic circuit when no defective bit is detected. The RAM 1 may be what is called a cell-based RAM by using memory cells of a dedicated layout pattern, or a gate-array RAM by using a gate array.

As described above, the semiconductor integrated circuit device of the first embodiment logically incorporates the redundant circuit in which redundant bits are formed by using another RAM other than the RAM 1. Therefore even after the completion of the layout design of the RAM 1, it is possible to form the semiconductor integrated circuit device having a redundant circuit by additionally incorporating the RAM 30, 40, 50, or 60 into the semiconductor integrated circuit device.

Second Embodiment

Figure 10A:
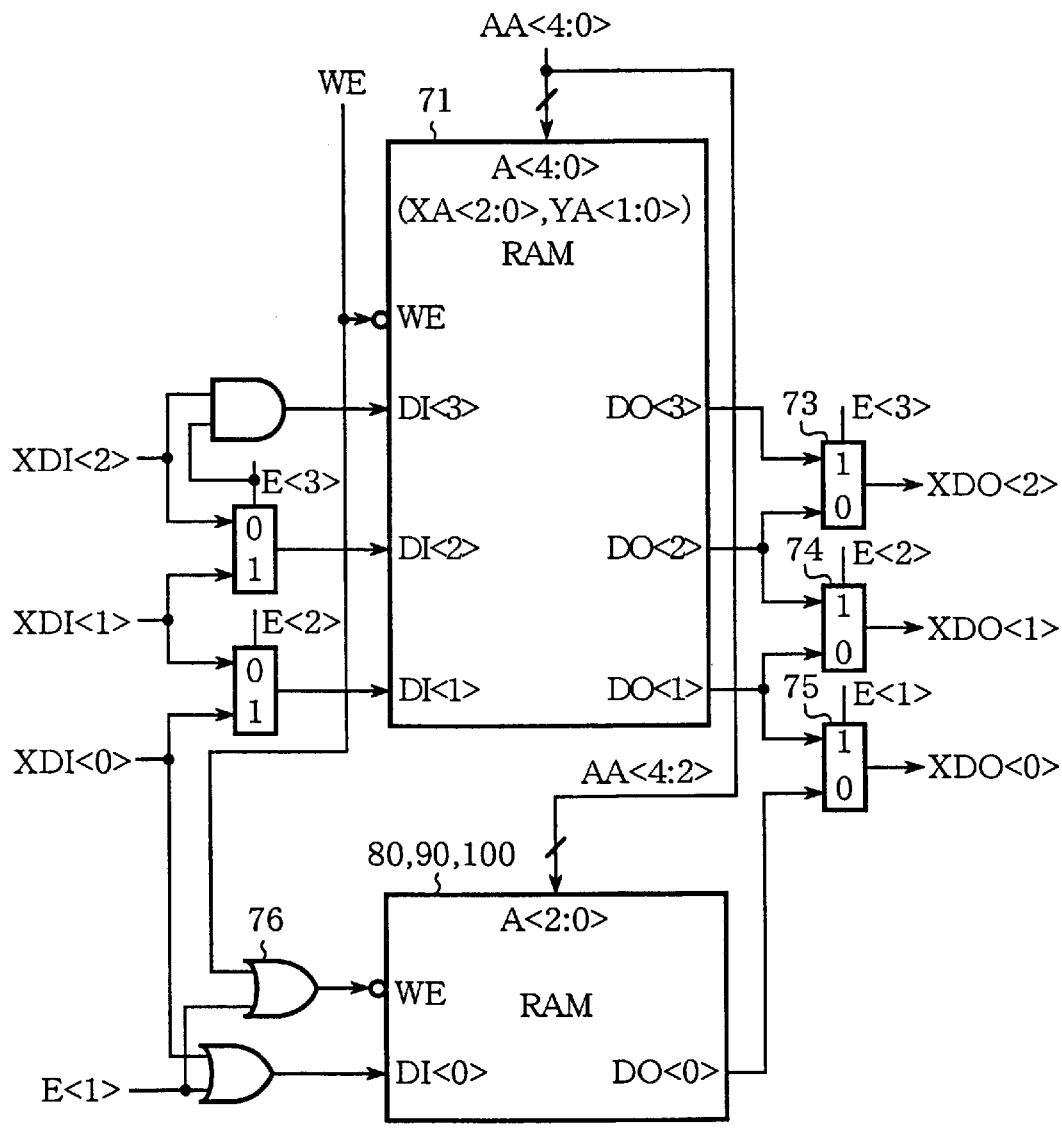
FIGS. 10A and 10B are circuit diagrams illustrating a semiconductor integrated circuit device according to a second embodiment of the present invention.
Figure 10B:
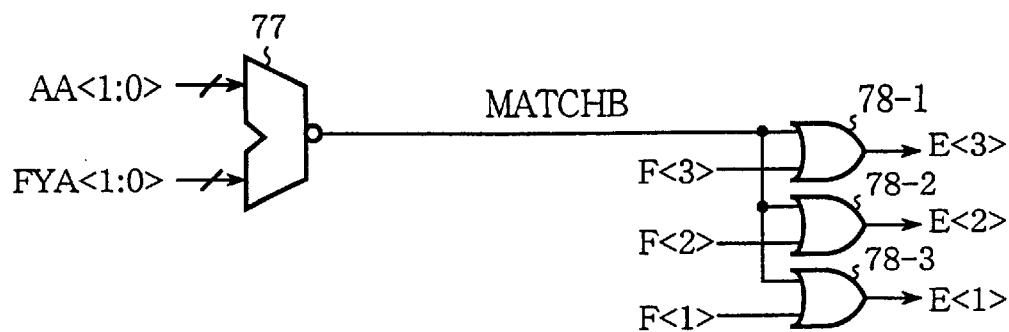

FIGS. 10A and 10B are circuit diagrams showing a semiconductor integrated circuit device according to the second embodiment of the present invention. In FIG. 10A, Reference numeral 71 designates a RAM having a test circuit. Reference numerals 80, 90 and 100 denote RAMs as redundant circuits, each of which is incorporated in the semiconductor integrated circuit device independently of the RAM 71. Reference numeral 73 denotes a selector circuit, 74 a selector circuit, 75 a selector circuit, and 76 an OR circuit. A redundancy control circuit for selecting the output data from each of the redundancy circuits 80, 90 and 100 is formed by the three selector circuits 73, 74 and 75.

FIG. 10B shows a circuit for generating control signals that are provided to the three selector circuits 73, 74 and 75 to control their operation. The control signal is generated based on signals F<1>, F<2> and F<3>. Reference numeral 77 denotes a comparator, and 78-1, 78-2 and 78-3 denote OR circuits.

Figure 11:
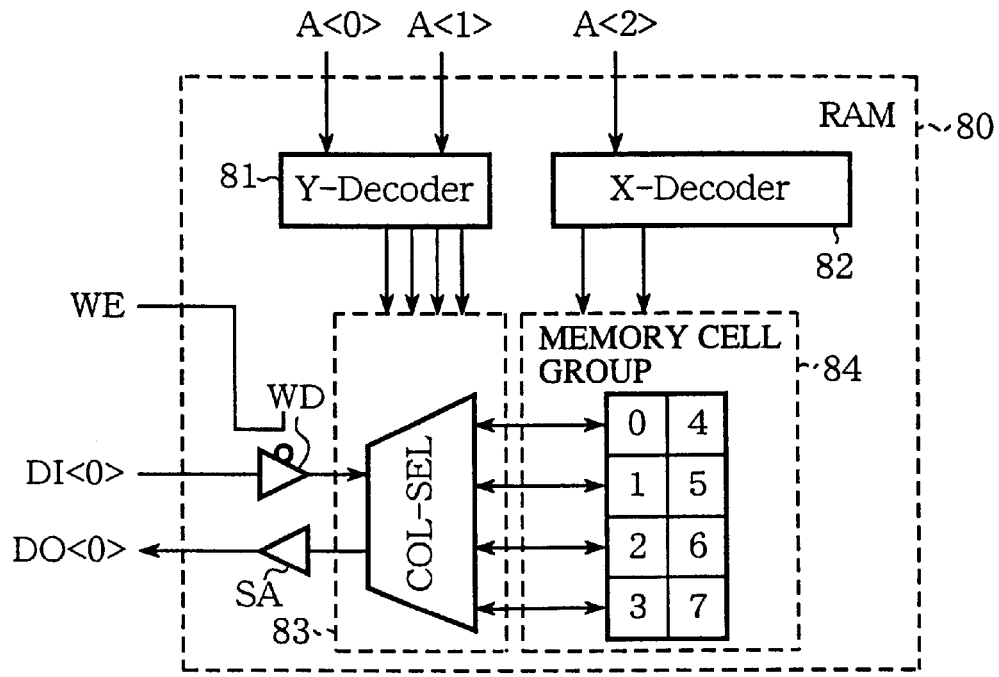
FIG. 11 is a circuit diagram illustrating a configuration of a redundant circuit in the semiconductor integrated circuit device shown in FIGS. 10A and 10B.
Figure 12:
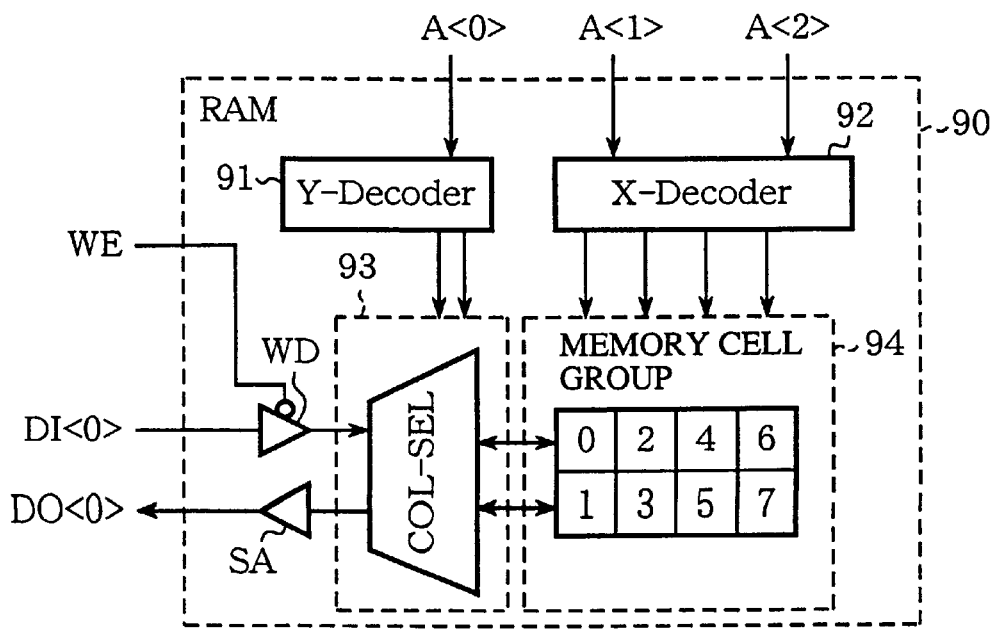
FIG. 12 is a circuit diagram illustrating another configuration of the redundant circuit in the semiconductor integrated circuit device shown in FIGS. 10A and 10B.
Figure 13:
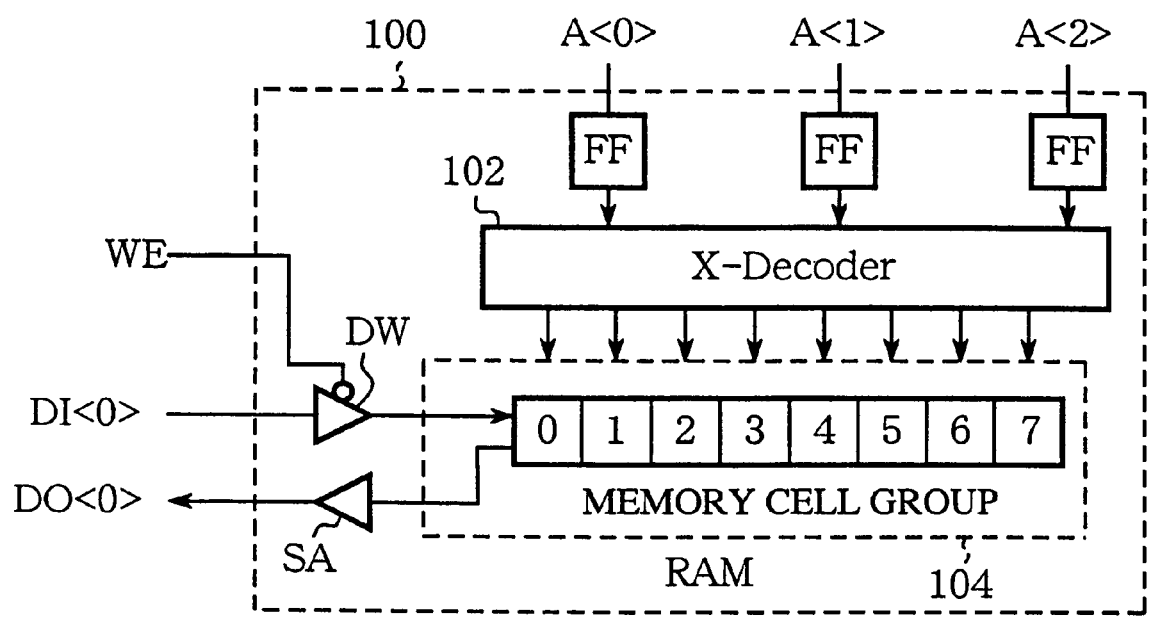
FIG. 13 is a circuit diagram illustrating still another configuration of the redundant circuit in the semiconductor integrated circuit device shown in FIGS. 10A and 10B.

FIGS. 11, 12 and 13 are circuit diagrams showing various configurations of the RAM shown in FIG. 10A as the redundancy circuit. In FIGS. 11, 12, and 13, Reference numerals 80, 90 and 100 designate RAMs as the redundant circuits shown in FIG. 10A, 81 and 91 denote address decoders (column decoders), 82, 92 and 102 indicate address decoders (row decoders), 83 and 93 designate column selectors, and 84, 94 and 104 denote memory cell groups. The numbers 0 through 7 in each memory cell group are addresses assigned to the respective memory cells.

FIG. 11 shows a circuit configuration of the RAM 80 of CPB=4, FIG. 12 a circuit configuration of the RAM 90 of CPB=2, and FIG. 13 a circuit configuration of the RAM 100 of CPB=1.

The RAMs 80, 90 and 100 shown in FIGS. 11, 12 and 13 are all applicable as the redundant circuits shown in FIG. 9. Moreover, memory circuits other than those shown in FIGS. 11 to 13 but logically equivalent thereto may also be incorporated as the redundant circuit in the semiconductor integrated circuit device shown in FIG. 10A.

Next, a description will be given of the operation of the second embodiment.

In the circuit shown in FIG. 10B, a signal FYA<1:0> is a signal that indicates a failing Y address in the RAM 71. This Y address is supplied from a control circuit (not shown). Accordingly, when there is no defective section in the RAM 1, the signal FYA<1:0> becomes an invalid value The comparator 77 compares the signal FYA<1:0> with the Y address (AA<1:0>) for the RAM 71 to be accessed, and when both match, its output signal MATCHB goes to 0 (MATCHB=0).

When the signal MATCHB is 1 (MATCHB=1), that is to say, when a non-defective Y address of the RAM 1 is specified, output signals E<3>, E<2> and E<1> from the OR circuits 78-1, 78-2 and 78-3 all go to 1 (E<3>=1, E<2>=1 and E<1>=1). In this situation, the selector circuit 75, which inputs the signal E<1>, selects the output DO<1> transferred from the RAM 71, and consequently, the RAM 80, 90, or 100 corresponding to redundant bits are not used in the operation of the semiconductor integrated circuit.

On the other hand, when the signal MATCHB is 0 (MATCHB=0), that is to say, when a defective Y address for the RAM 71 is specified, the signals F<> are transferred as the signals E<> through the OR circuits 78-1, 78-2 and 78-3. When the RAM 71 includes a defective bit, since the signal F<1> is 0 (F<1>=0), the signal E<1> goes to 0 (E<1>=0) accordingly and the RAM 80, 90, or 100 for redundant bits (that is to say, for the redundant circuit) is used.

As described above, according to the second embodiment, because the RAMs 80, 90 and 100 as redundant circuits are smaller in size than the RAMs 30, 40, 50 and 60 in the first embodiment, it is therefore possible not only to produce the effects obtainable with the first embodiment but also to reduce the circuit area of the semiconductor integrated circuit device even if the redundancy control circuit for generating the control signals made up of the comparator 77 and the OR gates 78-1 to 78-3 shown in FIG. 10B is incorporated therein. In other words, the semiconductor integrated circuit device of the second embodiment can be configured using the redundant circuit having memory cells forming a smaller number of bits than in the integrated circuit device of the first embodiment and can be reduced in circuit area accordingly.

Third Embodiment

Figure 14:
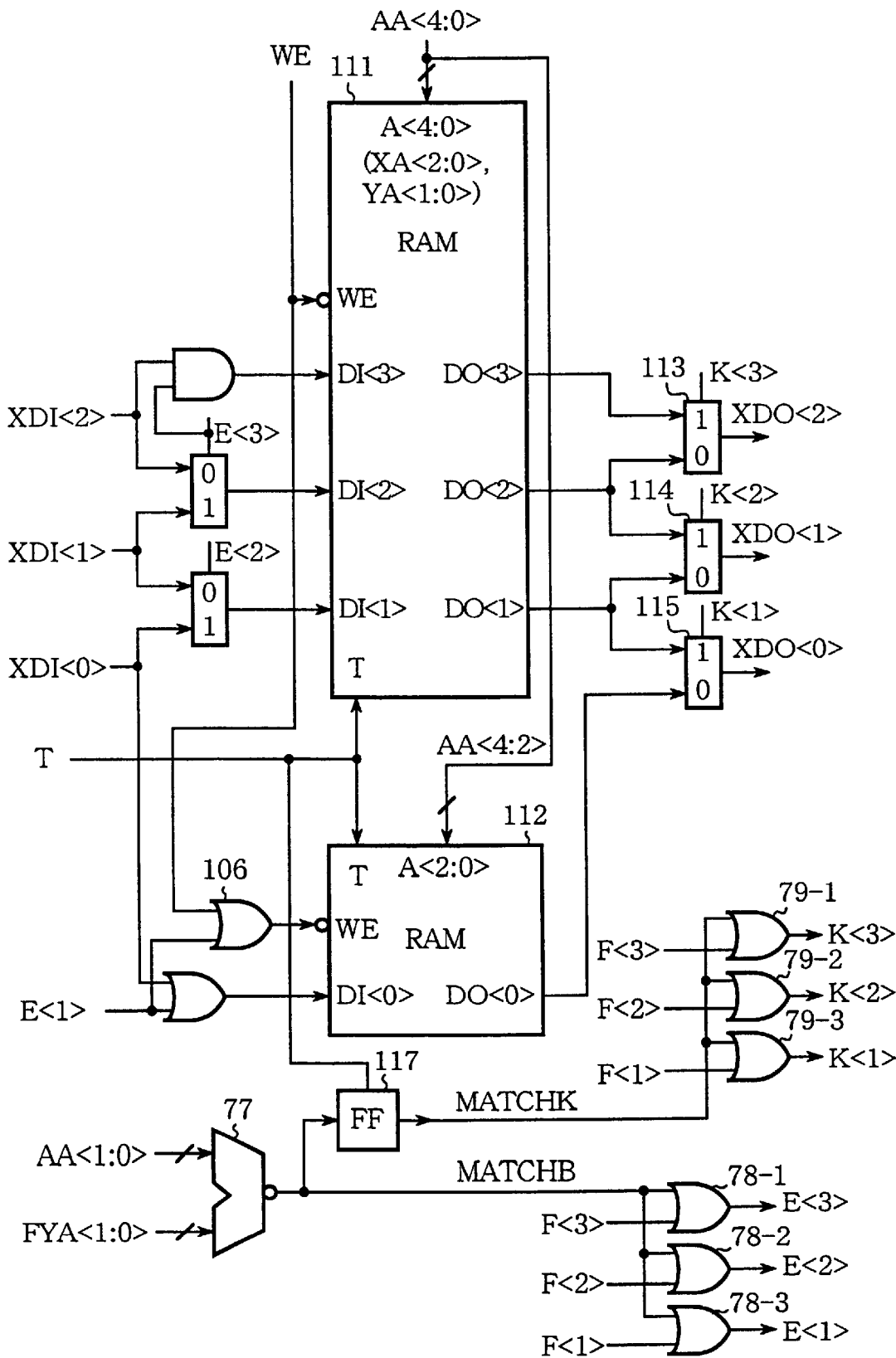
FIG. 14 is a circuit diagram illustrating a semiconductor integrated circuit device according to a third embodiment of the present invention.

FIG. 14 is a circuit diagram showing a semiconductor integrated circuit device according to the third embodiment of the present invention. In FIG. 14, Reference numeral 111 designates a RAM of a clock synchronous type whose operation is synchronized with a clock signal T, which contains a test circuit. Reference numeral 112 denotes a RAM of a clock synchronous type to be used as a redundant circuit, which is incorporated in the semiconductor integrated circuit device independently of the RAM 111 as a memory circuit.

Reference numeral 113 denotes a selector circuit, 114 a selector circuit, 115 a selector circuit, and 106 OR circuits. Reference numeral 117 indicates a flip-flop (FF) whose operation is controlled by the clock signal T.

A redundancy control circuit for controlling the operation of the RAM 112 serving as a redundant circuit comprises the three selector circuits 113, 114 and 115, a comparator 77, the flip-flop (FF) 117 and OR circuits 78-1, 78-2, 78-3, 79-1, 79-2 and 79-3 which generate signals K<>. The signals K<> controls the operation of the selectors 113 to 115.

The signals K<1>, K<2> and K<3> are output signals from the OR circuits 79-1, 79-2 and 79-3 by which test results F<3>, F1<2> and F<1> fed from the RAM 111 of the clock synchronous type with a test circuit are ORed with a signal MATCHK transferred from the flip-flop (FF) 117, and the output signals K<1>, K<2> and K<3> are applied to the selector circuits 113, 114 and 115, respectively.

Figure 15:
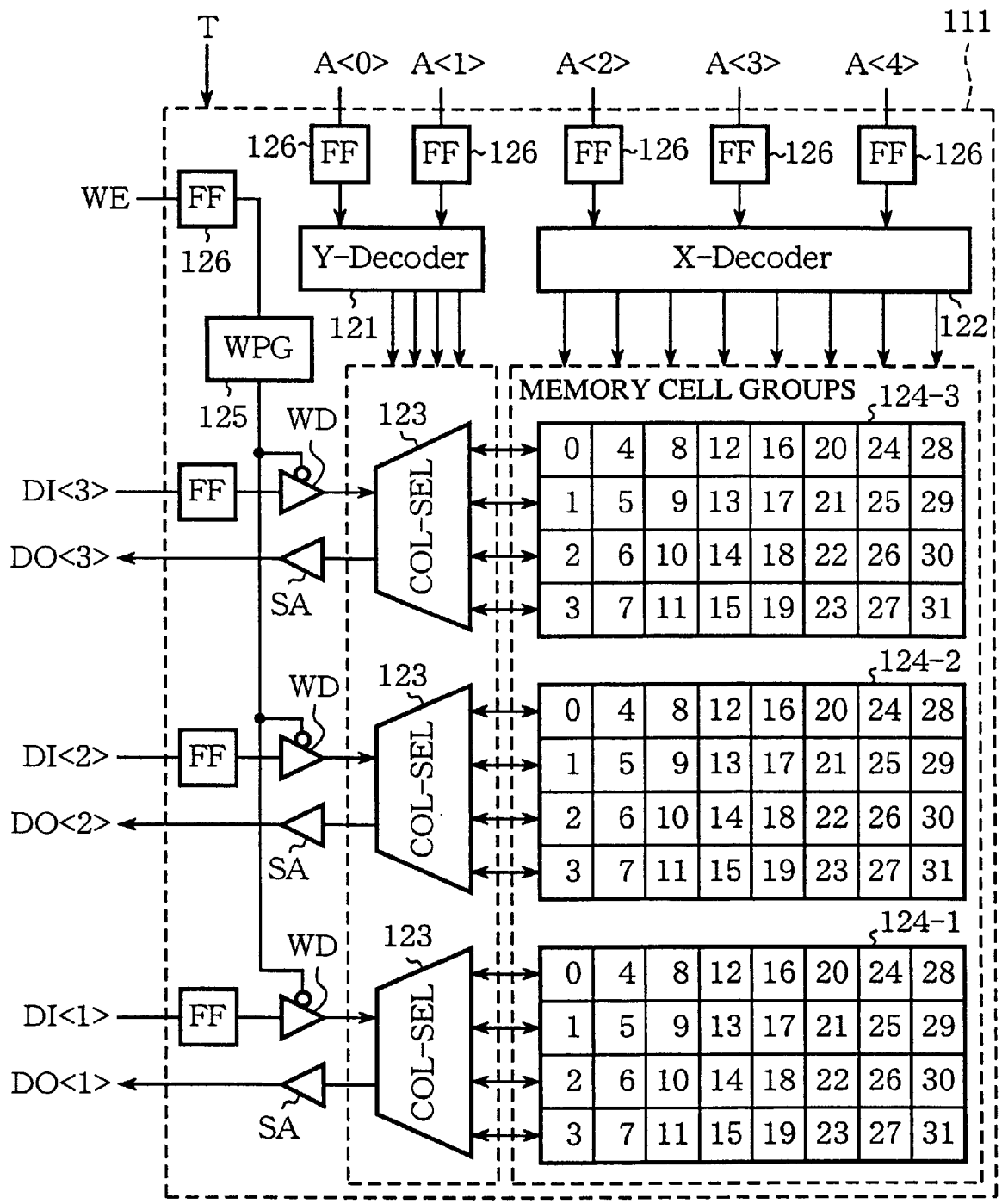
FIG. 15 is a circuit diagram illustrating a RAM in the semiconductor integrated circuit device shown in FIG. 14.

FIG. 15 is a circuit diagram showing the RAM 11 of the clock synchronous type in the semiconductor integrated circuit device having the configuration of 32 words×3 bits shown in FIG. 14. Reference character WD denotes each of write drivers and SA each of sense amplifiers. Reference numeral 121 designates an address decoder (a column decoder), 122 an address decoder (a row decoder), and 123 a column selector. Reference numerals 124-1, 124-2 and 124-3 indicate memory cell groups, every triad of memory cells constitute one word. Accordingly, the RAM 111 shown in FIG. 15 has the configuration of the RAM of 32 words×3 bits.

Reference character WPG designates a write pulse generator circuit. The numbers 0 trough 31 attached to respective memory cells in each of the memory cell groups 124-1, 124-2 and 124-3 represent memory cell addresses. FIG. 15 shows the case of the RAM 111 in which the number of columns per I/O bit, CPB is four (CPB=4).

Next, a description will be given of the operation of third embodiment.

The RAM 111 in the semiconductor integrated circuit device according to the third embodiment is a RAM of the clock synchronous type. The RAM 111 has the flip flops 126 for input signals WE, DI<3>, DI<2>, DI<1> and whose operation is controlled by the clock signal T. Latch circuits may be used as substitutes for the flip-flops (FF) 126.

Like the RAM 111 shown in FIG. 14, the RAM 112 is also the RAM of the clock synchronous type and can be configured by adding the write pulse generator circuit (WPG) 125 and flip-flops (FF) 126 to the RAM 80, 90, or 100 shown in FIGS. 11, 12, or 13 described previously with reference to the second embodiment.

The RAM 112 contains memory cells corresponding to one bit line of the RAM 111. As compared with the semiconductor integrated circuit device shown in FIGS. 10A and 10B, the integrated circuit device shown in FIG. 14 is additionally provided with the flip-flop (FF) 117 and the OR circuits 79-1, 79-2 and 79-3.

The flip-flop (FF) 117 inputs thereinto a control signal MATCHB and outputs the control signal MATCHK, which is fed to the OR circuits 79-1, 79-2 and 79-3 to control their operation. The selector circuits 113, 114 and 115, which constitute the output portion of the semiconductor integrated circuit device, are controlled by the signals K<3>, K<2> and K<1> that are transferred from the OR circuits 79-1, 79-2 and 79-3.

The output from the RAM 111 of the clock synchronous type is switched by inputting the clock signal T as a trigger signal, and it is necessary that the clock signal T also act as a trigger signal for the selector circuits 113, 114 and 115 for redundancy switching use. In order to achieve this requirement, the flip-flop (FF) 117 and the OR circuits 79-1, 79-2 and 79-3 are incorporated in the semiconductor integrated circuit device.

As described above, according to the third embodiment, Even if the RAM of the clock synchronous type is used as the memory circuit and the redundant circuit, it is possible to form the RAM equipped with the redundancy function by the addition of memory cells forming a smaller number when compared with the RAMs incorporated in the semiconductor integrated circuit device of the first embodiment and in the conventional one.

Fourth Embodiment

Figure 16:
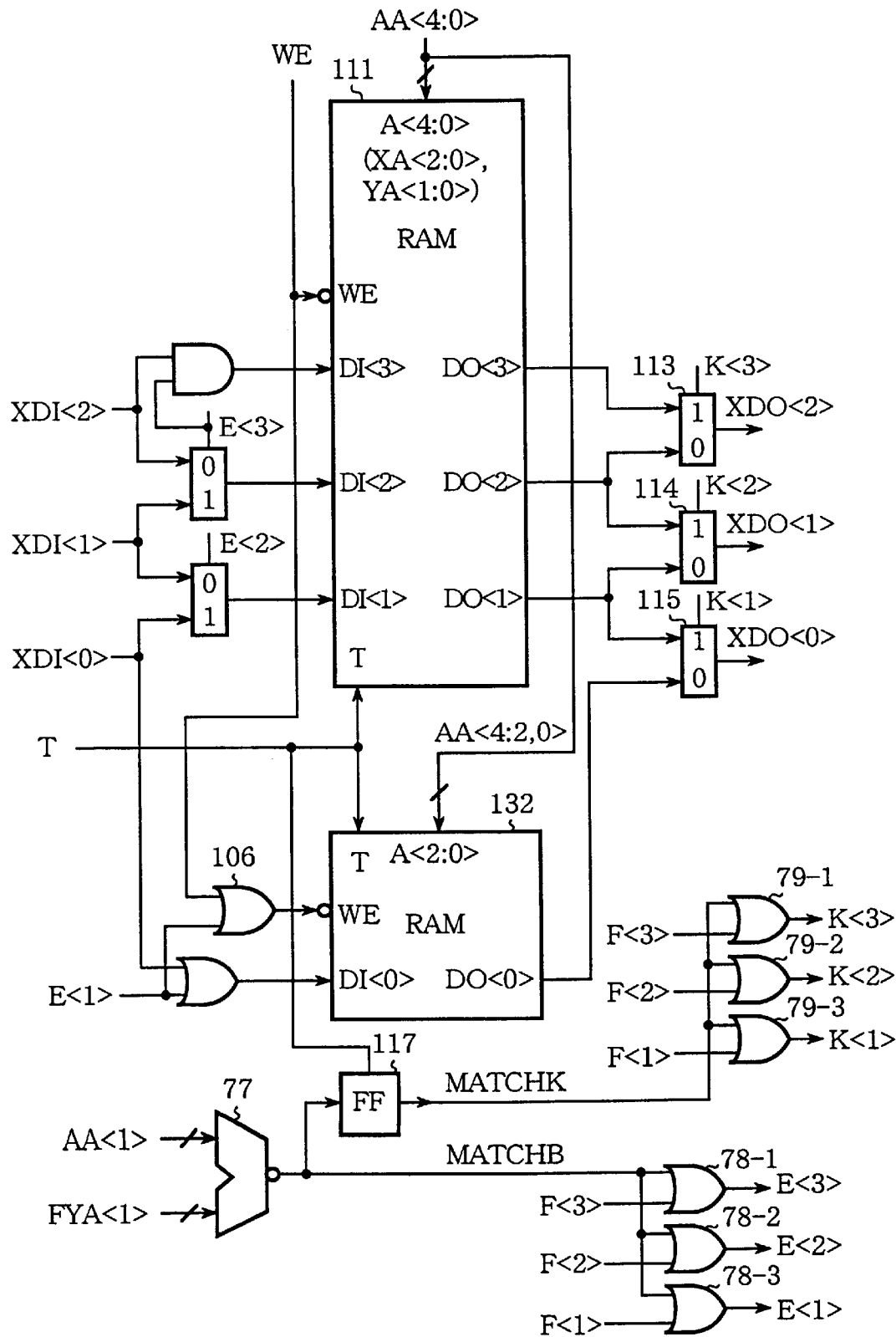
FIG. 16 is a circuit diagram depicting a semiconductor integrated circuit device according to a fourth embodiment of the present invention.

FIG. 16 is a circuit diagram showing a semiconductor integrated circuit device according to the fourth embodiment of the present invention. In FIG. 16, Reference numeral 132 denotes a RAM used as a redundant circuit which contains memory cells corresponding to two bit lines of the RAM 111. In this case, CPB=4.

Figure 17:
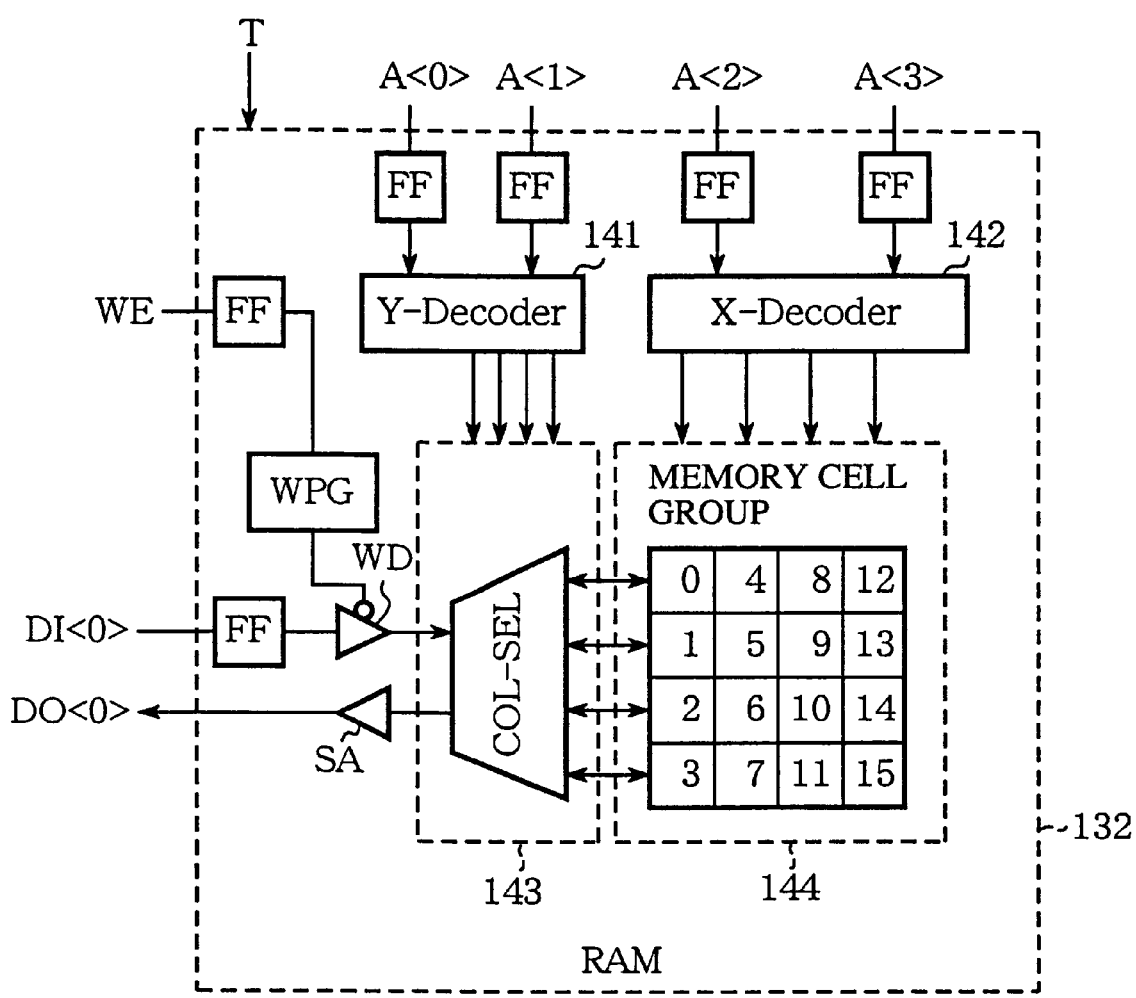
FIG. 17 is a circuit diagram illustrating a configuration of a redundant circuit in the semiconductor integrated circuit device shown in FIG. 16.

FIG. 17 is a circuit diagram showing the configuration of the RAM 132. In FIG. 17, Reference numeral 141 designates a column decoder, 142 a row decoder, 143 a column selector, 144 a memory cell group, SA a sense amplifier, and WD a write driver. The semiconductor integrated circuit device of the fourth embodiment is identical in construction to the integrated circuit device of the fourth embodiment except above. Accordingly, the configuration elements corresponding to those in the latter are identified by the same reference numerals and no description will be repeated in respect of them.

Next, a description will be given of the operation of the fourth embodiment.

A signal FYA<1> is a signal that represents the range of a defective Y address (which is provided from a control circuit not shown) in the RAM 111, for example, the upper order bits in the failing Y address. With no bit failure in the RAM 11, the signal FYA<1> becomes an invalid value.

The comparator 77 compares the defective Y address range (FYA<1>) with the Y address range (AA<1>) in the RAM 111 to be accessed. When both match, the output signal MATCHB from the comparator 77 goes to 0 (MATCHB=0).

As referred previously with reference to the third embodiment, when no bit failure is detected in the RAM 111, that is to say, when the signal FYA<1> is an invalid value, the RAM 132 as the redundant bit is not used.

When the signal FYA<1> obtained by the test to the RAM 111 is a valid value, that is to say, when it represents the Y address range of a bit failure, the RAM 132 as the redundant bit is used.

According to the fourth embodiment shown in FIG. 16, the RAM with the redundancy function can be formed by the addition of a redundant circuit having memory cells that form a smaller number of bits than needed in the prior art and in the first embodiment. That is to say, it is possible to suppress an increase in the circuit area of the semiconductor integrated circuit device. Incidentally, the fourth embodiment permits recovery from a failure corresponding to two bit lines, and hence it is advantageous over the second and third embodiments in that a short in the bit lines or the like can be recovered. The operation of the RAM in the semiconductor integrated circuit can be thereby performed correctly.

The RAM 111 in the semiconductor integrated circuit device according to the fourth embodiment shown in FIG. 16, has the configuration of CPB=4 and the RAM 132 is the redundant circuit correspond to two bit lines in the RAM 111. In general, however, the configuration of the RAM 111 and the configuration of the RAM 132 as the redundant circuit satisfy the following relationship:

When there is the RAM 111 of CPB=n (n is a positive integer), the RAM 132 as the redundant circuit is made up of a memory cells corresponding to m bit lines (where m<n) in the RAM 111 and the configuration of the comparator 77 is correctly changed based on the configuration of the RAM 132.

While the fourth embodiment has been described to employ the RAMs 111 and 132 of the clock synchronous type, the present invention is not limited specifically thereto but can be applied to the recovery of a failure over m bit lines in a RAM of a non-clock synchronous type.

In the fourth embodiment, the redundant circuit has been described to be composed of two bit lines, but it is a matter of course that more bit lines may be provided. For example, the configuration of the RAM having an array of four columns×eight rows can be changed to that having an array of eight columns×four rows, in which case the number of bit lines is four.

As described above, according to the fourth embodiment, since memory cells are added as a redundant circuit that has a smaller number of bits than in the prior art and in the first embodiment, it is possible to suppress an increase in the circuit area of the semiconductor integrated circuit device. Furthermore, the four embodiment permits recovery from a failure corresponding to two bit lines, and hence it is advantageous over the second and third embodiments in that a short in the bit lines or the like can be recovered.

Fifth Embodiment

Figure 18:
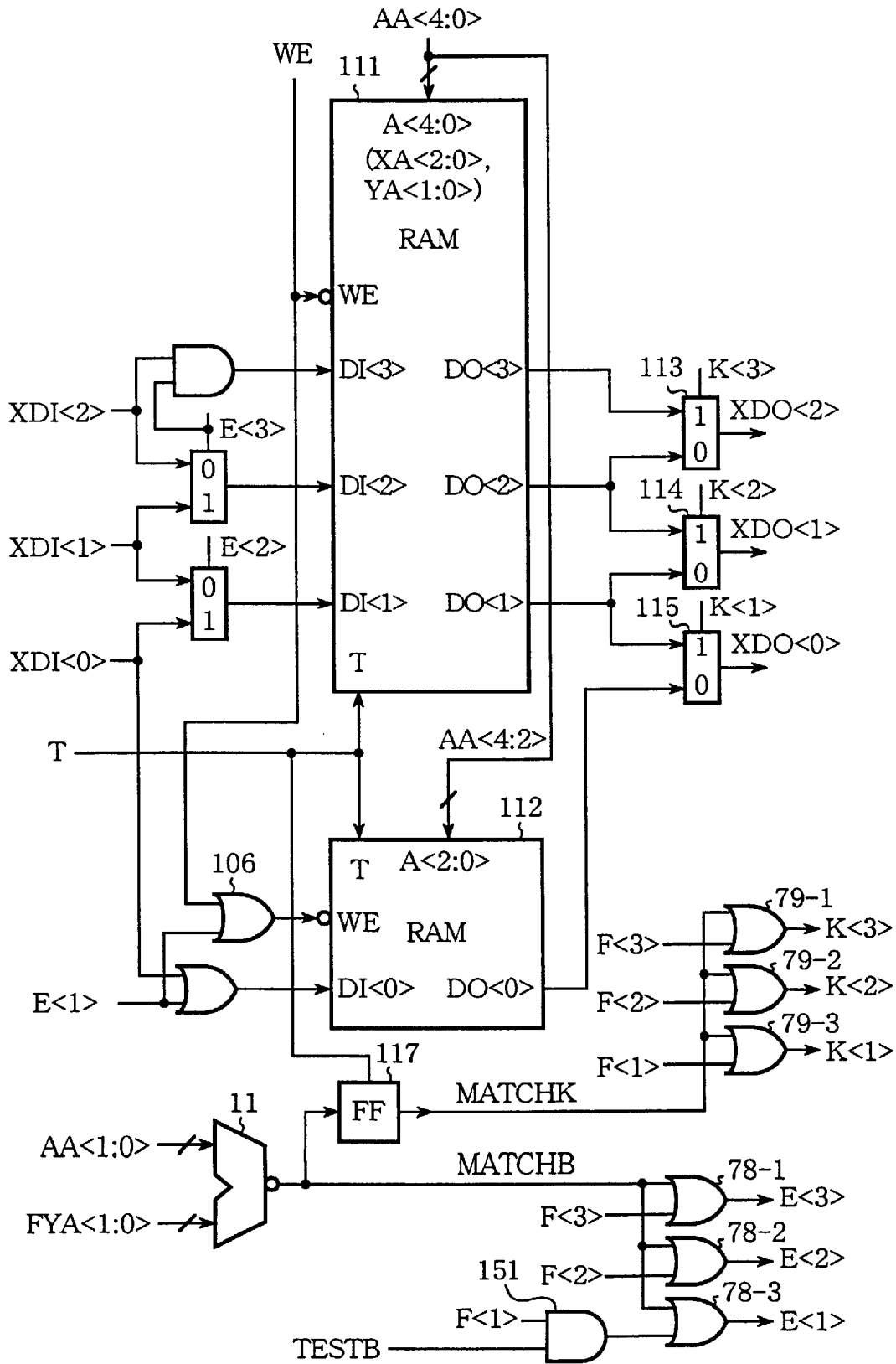
FIG. 18 is a circuit diagram illustrating a semiconductor integrated circuit device according to a fifth embodiment of the present invention.

FIG. 18 is a circuit diagram showing a semiconductor integrated circuit device according to the fifth embodiment of the present invention. In FIG. 18, Reference numeral 151 denotes an AND circuit which performs an AND operation between a signal TESTB and the signal F<1>. The output from the AND circuit 151 is transferred to the OR circuit 78-3. The other configuration elements in the semiconductor integrated circuit of the fifth embodiment are identical to those in the third and fourth embodiments shown in FIGS. 14 and 16, they are therefore identified by the same reference numerals and no description will be repeated in respect of them.

Next, a description will be given of the operation of fifth embodiment.

The semiconductor integrated circuit device of the fifth embodiment differs from the integrated circuit device of the third embodiment in the provision of the AND circuit 151 to which the signal TESTB is inputted. By setting the signal TESTB at 0, the value of the signal E<1> becomes equal to the value of the signal MATCHB (E<1>=MATCHB). Accordingly, only when both the address AA<1:0> and the signal FYA<1:0> match, the RAM 112 may enter a write enable state.

By controlling the write enable signal WE while supplying addresses AA<4:0> to the RAM 111 and the RAM 112, the RAM 111 and the RAM 112 as a redundant circuit can simultaneously be tested (a march test, for instance) as a 32-word RAM.

As described above, according to the fifth embodiment, the AND circuit 151 is further incorporated in the semiconductor integrated circuit device, into which the signal TESTB is inputted. Accordingly, by setting the signal TESTB at 0 (TESTB=0), the RAM 112 may enter the write enable state only when both the address AA<1:0> and the signal FYA<1:0> match. And, by controlling the write enable signal WE while supplying the address AA<4:0> to the RAMs 111 and 112, the both the RAM 111 as the memory circuit and the RAM 112 as the redundant circuit can simultaneously be tested (a march test, for instance) as one 32-word RAM.

Sixth Embodiment

Figure 19:
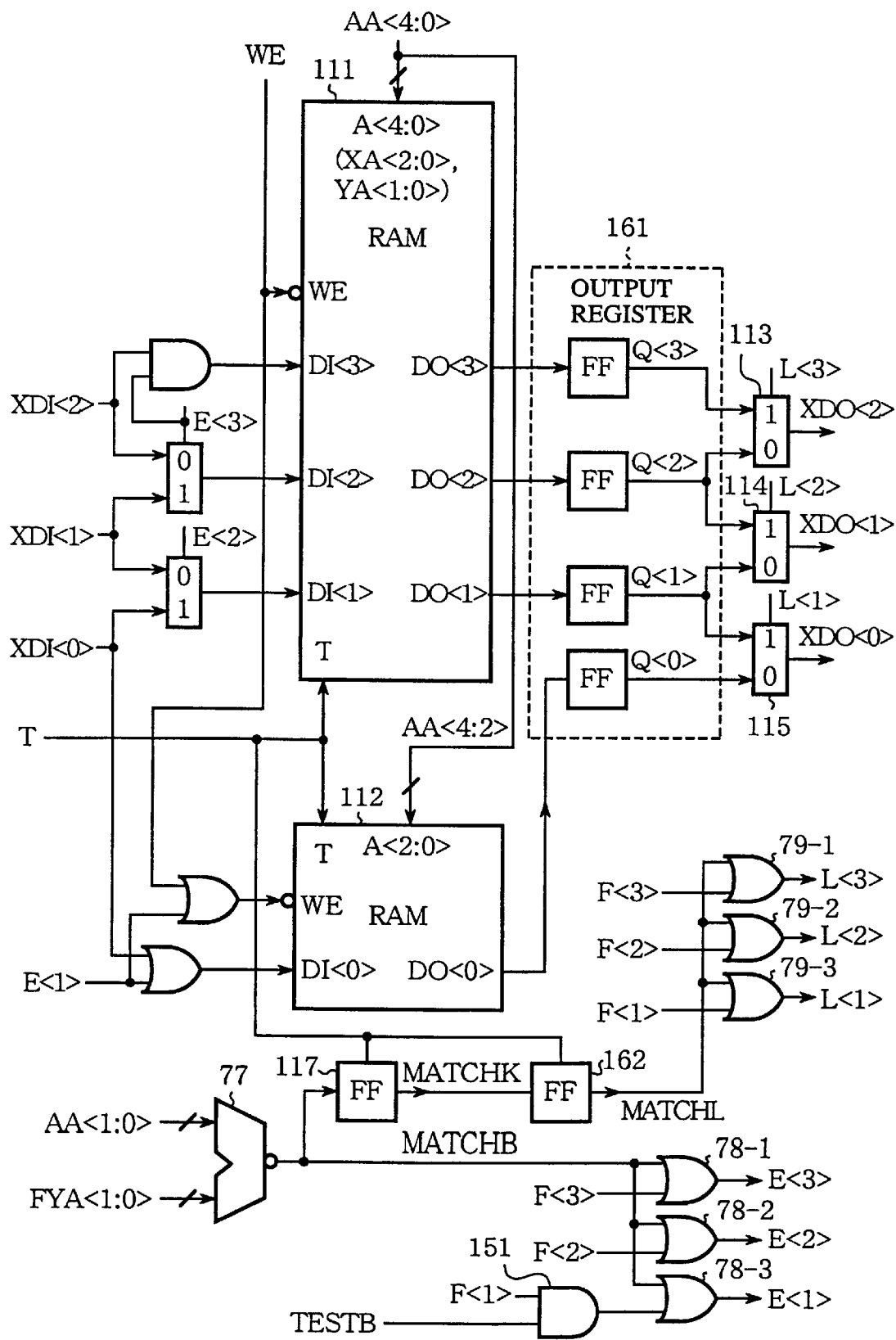
FIG. 19 is a circuit diagram illustrating a semiconductor integrated circuit device according to a sixth embodiment of the present invention.

FIG. 19 is a circuit diagram showing a semiconductor integrated circuit device according to the sixth embodiment of the present invention. In FIG. 19, Reference numeral 161 designates an output register which holds output data transferred from the RAM 111, and 162 denotes a flip-flop which delays the signal MATCHK transferred from the flip flop (FF) 117 by a predetermined time interval to provide a signal MATCHL. The other configuration elements in the semiconductor integrated circuit device according to the sixth embodiment are identical to those in the fifth embodiment. Accordingly, they will be identified by the same reference numerals and no description will be repeated in respect of them.

Next, a description will be given of the operation of the sixth embodiment.

Figure 1:
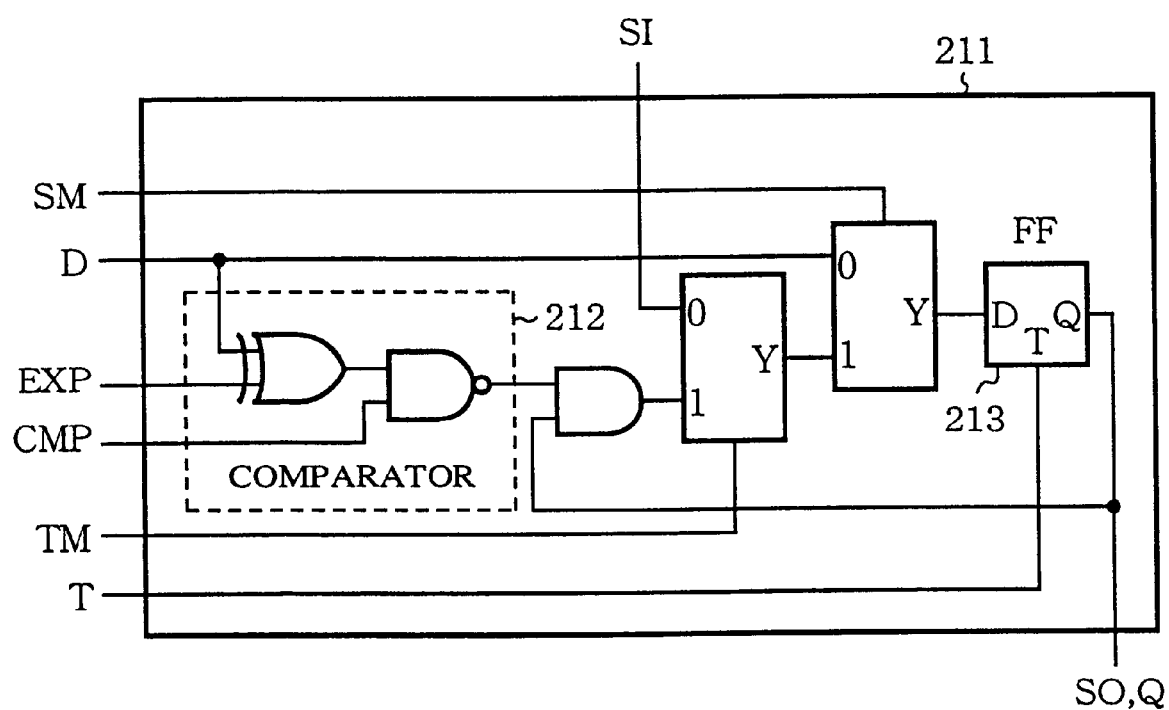
FIG. 1 is a circuit diagram depicting a scan flip-flop for testing a conventional memory circuit such as a RAM.
Figure 2:
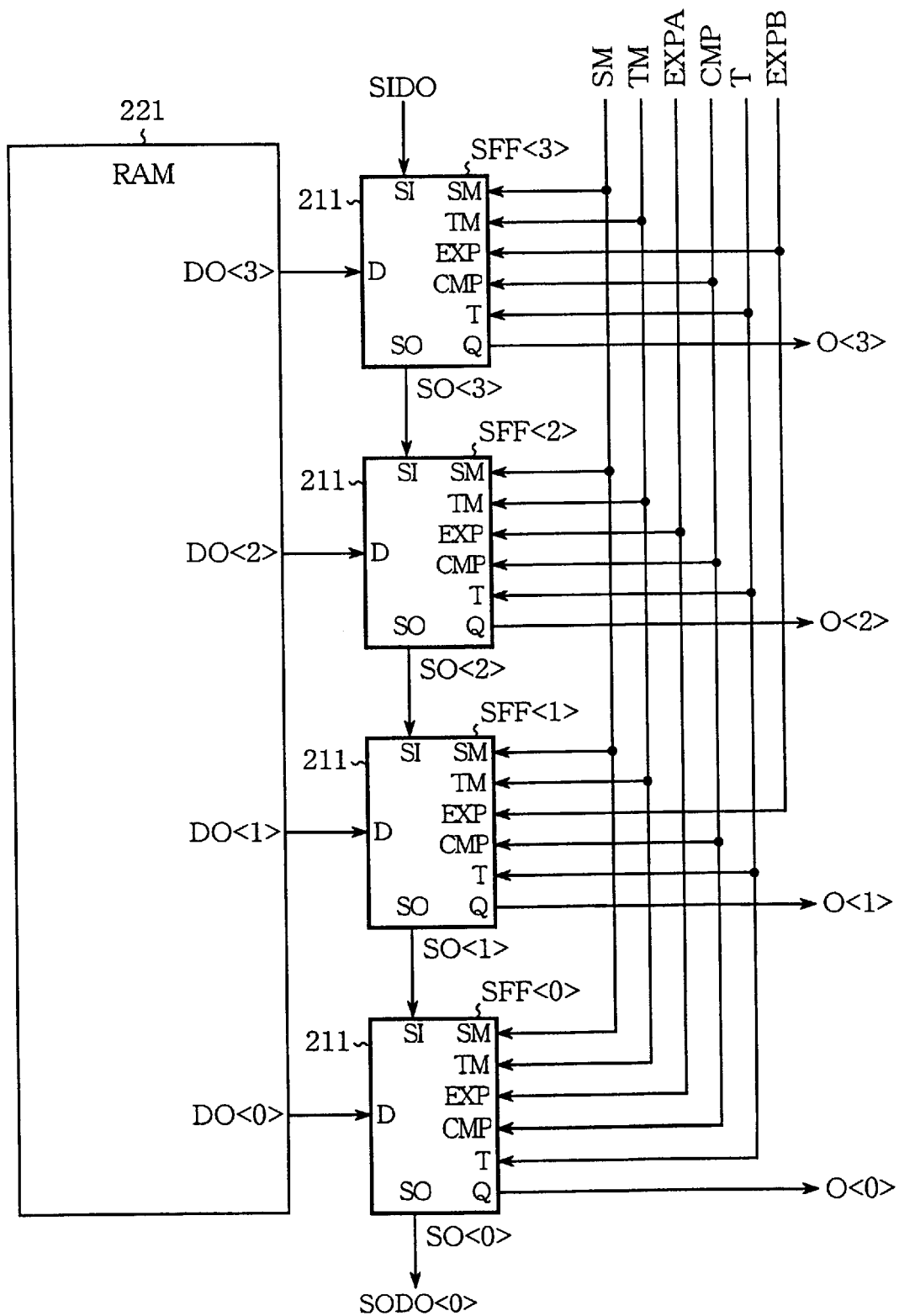
FIG. 2 is a block diagram depicting a conventional memory circuit such as a RAM equipped with a test circuit.
Figure 3:
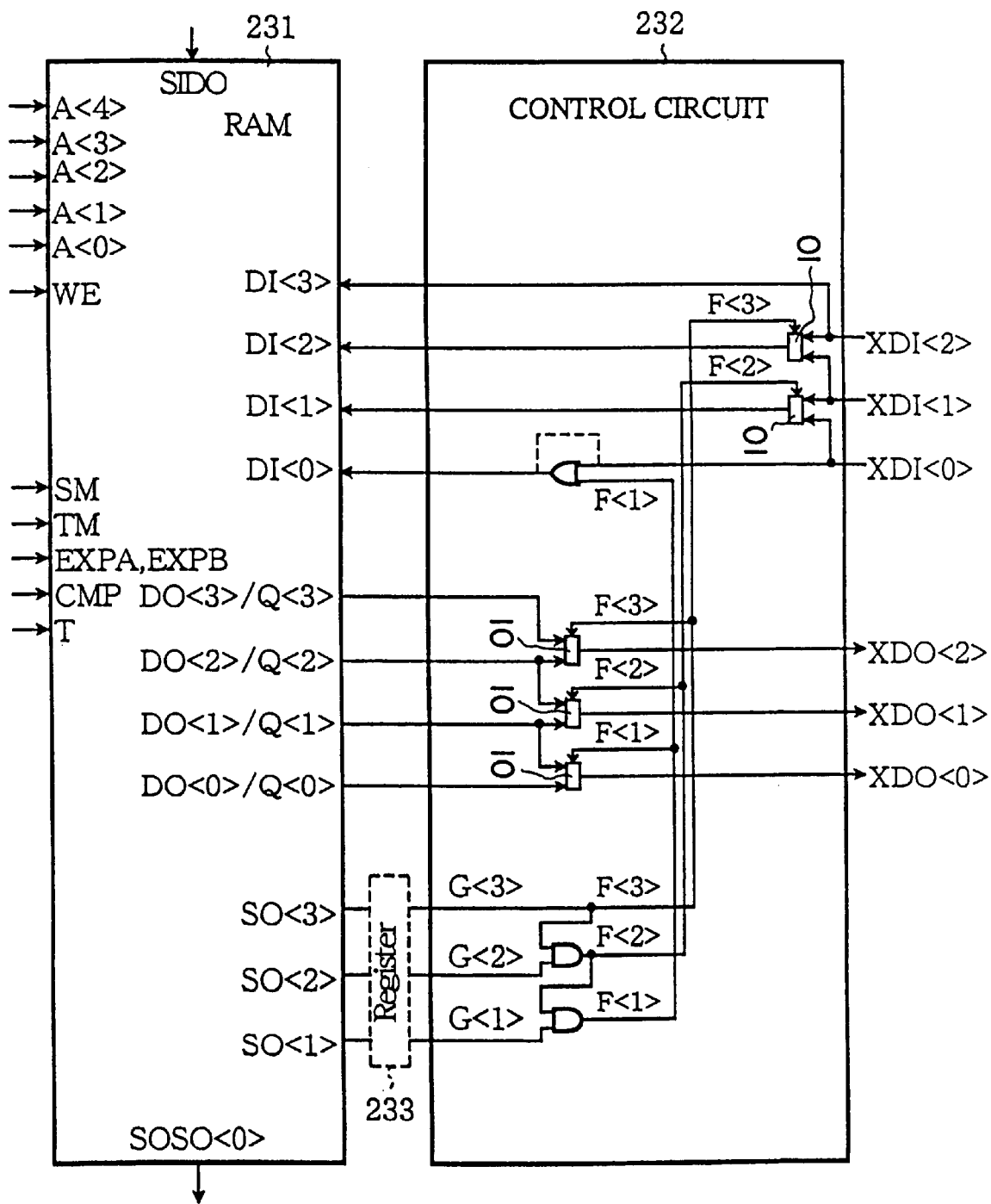
FIG. 3 is a block diagram showing a conventional memory circuit such as a RAM equipped with a test circuit and a redundant circuit.

In the semiconductor integrated circuit device of the sixth embodiment, the output register 161 is incorporated in the data output portion of the RAM 111 to temporarily hold the output data therefrom. The output register 161 may be formed by using the flip-flop (FF) 213 in the scan flip-flop 211 in the conventional example shown in FIG. 1.

As mentioned above, the flip-flop (FF) 162 delays the output signal MATCHK transferred from the flip-flop (FF) 117 by a predetermined time interval and outputs the signal MATCHL. The operations of the OR circuits 79-1, 79-2 and 79-3 are controlled by this signal MATCHL.

The operations of the selector circuits 113, 114 and 115 for redundancy switching use in the data output part of the RAM 111 are controlled based on the output signals L<3>, <2> and L<1> provided from the OR circuits 79-1, 79-2 and 79-3.

As described above, according to the sixth embodiment, since the output register 161 and the flip-flop (FF) 162 may be additionally incorporated in the semiconductor integrated circuit device, a RAM of a clock synchronous type with the output register 161 may be used to form a RAM with the redundancy function in the semiconductor integrated circuit, and this RAM has memory cells of a smaller number of bits than in the conventional example and in the first embodiment.

Seventh Embodiment

Figure 20:
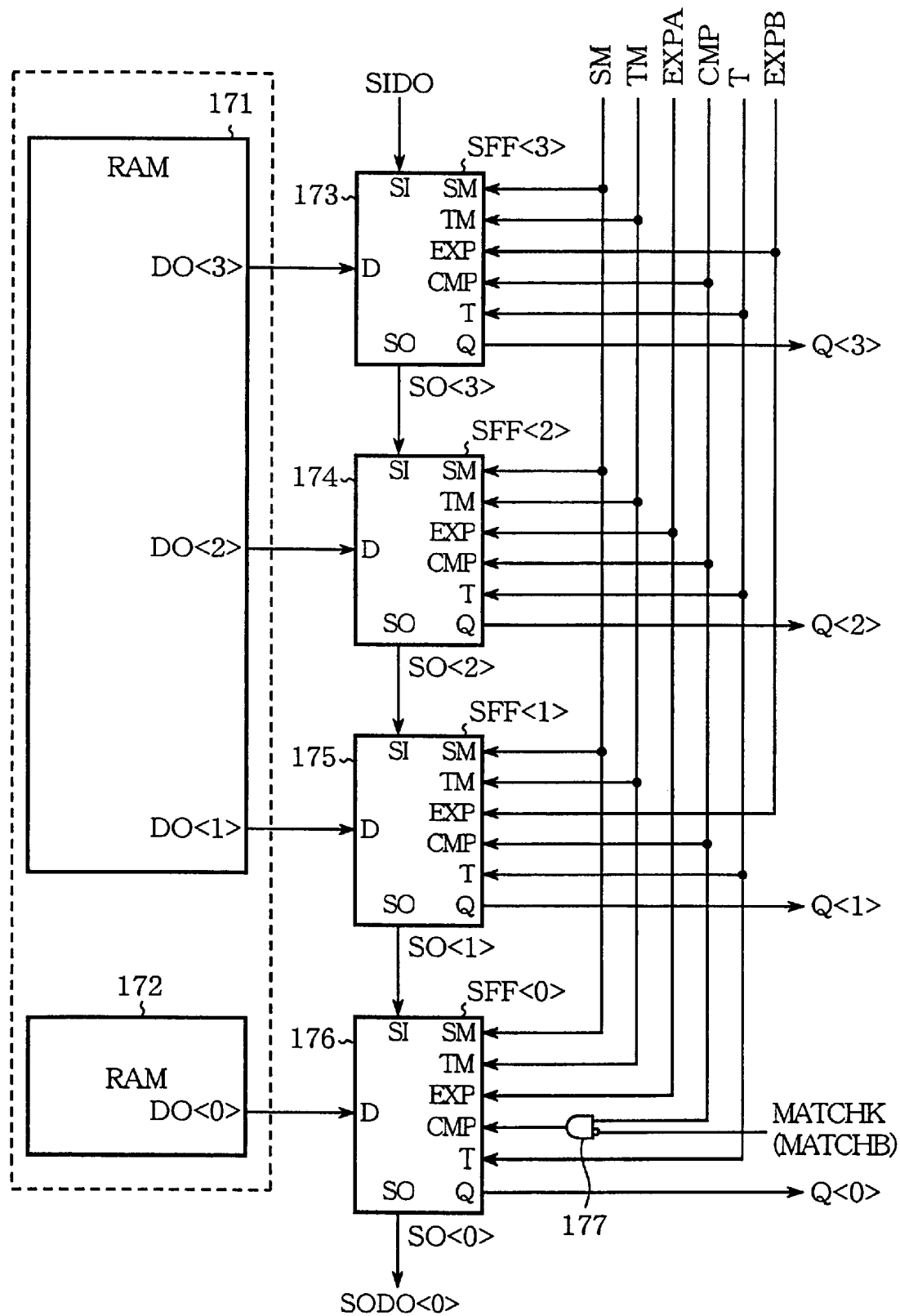
FIG. 20 is a circuit diagram illustrating a semiconductor integrated circuit device according to a seventh embodiment of the present invention.

FIG. 20 is a circuit diagram showing a semiconductor integrated circuit device according to the seventh embodiment of the present invention, in which a test circuit is added to the RAM. In FIG. 20, Reference numeral 171 designates a RAM that is used as a memory circuit, and 172 denotes a RAM that is used as a redundant circuit. Reference numerals 173 to 176 indicate scan flip-flops (forming a scan path circuit) for test use, which are connected in series. Reference numeral 177 denotes a gate circuit, into which a control signal transferred from the comparator 77 (not shown in FIG. 20) is inputted.

Next, a description will be given of the operation of the seventh embodiment.

In the semiconductor integrated circuit device of the seventh embodiment shown in FIG. 20, a test circuit for testing the output data DO<> transferred from the RAM 171 is formed by the series connection of the four scan flip-flops 173 to 176.

In this configuration, during test for the RAM 171 its comparing operation need to be suppressed in accordance with the address. This can be done using the signal MATCHB, MATCHK, or MATCHL that is generated by and transferred from the comparator 77 (not shown in FIG. 20).

The signal. MATCHB, MATCHK, or MATCHL from the comparator 77 is transferred through the gate circuit 177 into the scan flip-flop 176. Because the RAM 171 has a memory configuration of 32 words and RAM 172 of 16 words, when the both RAMs 171 and 172 are tested as a single 32-word RAM by inputting address signals, the RAM 171 is accessed twice. In this case, since the RAM 172 needs only to be accessed once (in the first or second access), the operation of the RAM 172 is halted through the gate circuit 177.

As described above, according to the seventh embodiment, the RAM 171 is logically equipped with a redundant circuit formed by combining therewith another RAM 172 having memory cells incorporated therein for redundant bits. Therefore, even after the completion of the layout design of the RAM 171, the RAM 172 can be additionally incorporated into the semiconductor integrated circuit device as a redundant circuit to form the semiconductor integrated circuit device having the redundant circuit.

Eighth Embodiment

Figure 21:
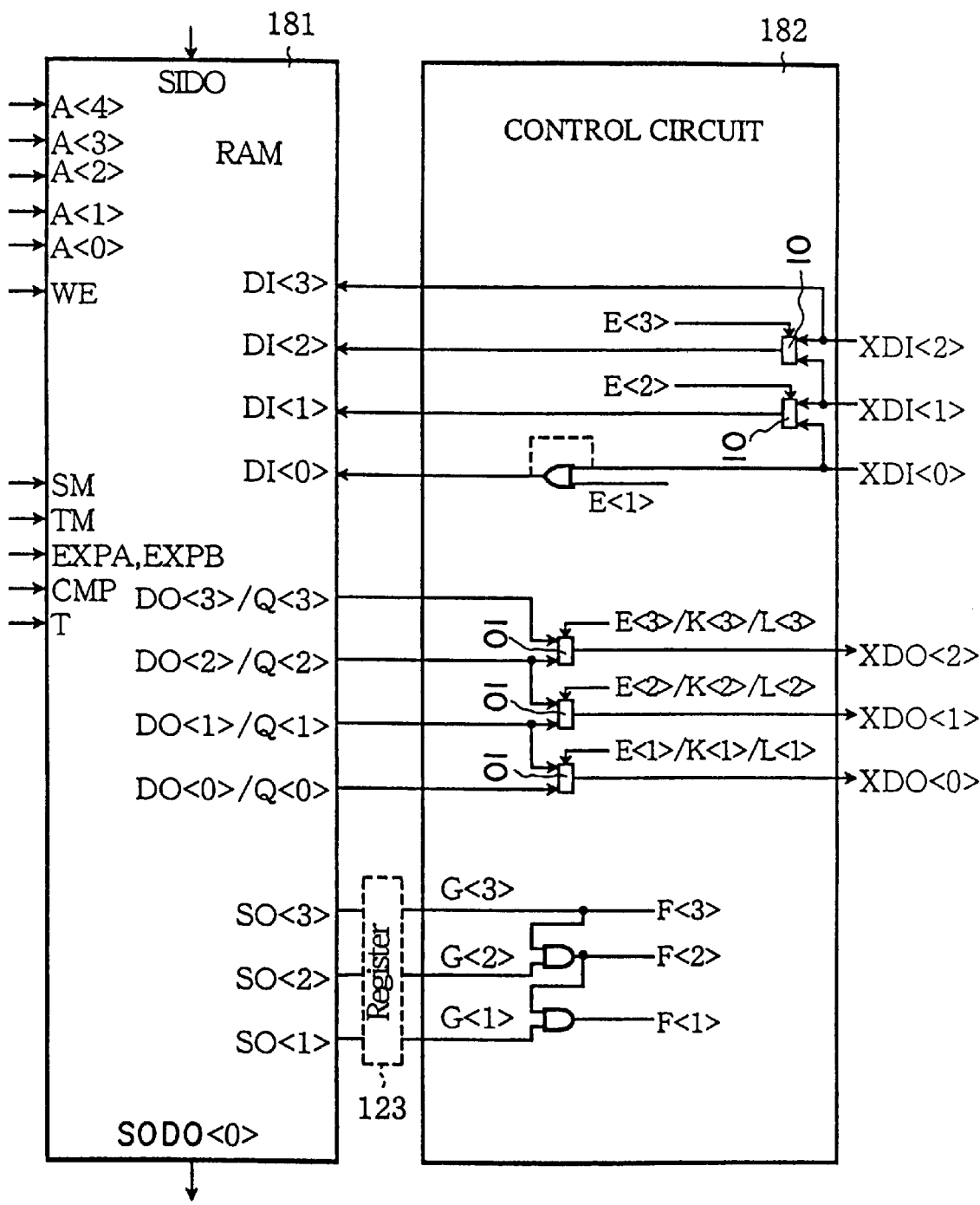
FIG. 21 is a circuit diagram illustrating a semiconductor integrated circuit device according to an eighth embodiment of the present invention.

FIG. 21 is a circuit diagram showing a semiconductor integrated circuit device according to the eighth embodiment of the present invention. In FIG. 21, Reference numeral 181 denotes a RAM having a test circuit and a redundant circuit, which corresponds to the RAMs 1, 71, 111 and RAMs 30, 40, 50, 60, 80, 90, 112 and 132 described previously with reference to the first through sixth embodiments. Reference numeral 182 denotes a control circuit.

Next, a description will be given of the operation of the eighth embodiment.

The selectors for redundancy switching use located at the data output portion of the RAM 181 through which the data from the RAM 181 having the test circuit and the redundant circuit is output are connected as follows.

When a RAM of a clock asynchronous type is used, the selectors input data DO<> transferred from the RAM, and the operation of the selectors is controlled by using the signals E<>. When a RAM of a clock synchronous type not having output registers is used, the selectors input the data DO<> from the RAM, and the operation of the selectors is controlled by using the signals K<>.

When a RAM of a clock synchronous type having output registers is used, the selectors input the data DO<> from the RAM, and the operation of the selectors is controlled based on the signals L<>.

In the first to ninth embodiments of the present invention described above, a single-port RAM is used. The present invention is not limited by those configurations, it is also applicable to multi-port RAMS such as two- and three-port RAMs, and the same effects as described above can be obtained.

It is also possible to use, as a RAM for a redundant circuit, a multi-port RAM which has a larger number of ports than the RAM used as a memory circuit and the RAM as a redundant circuit. For instance, a single-port RAM may be used as a memory circuit and a two-port RAM is used as a redundant circuit. The reason for this is that the two-port RAM can be operated as a single-port RAM by connecting the addresses of the two ports in common. Furthermore, in a two-port RAM with independently addressable read-only and write-only ports, read and write addresses need only to be connected in common.

Figure 22:
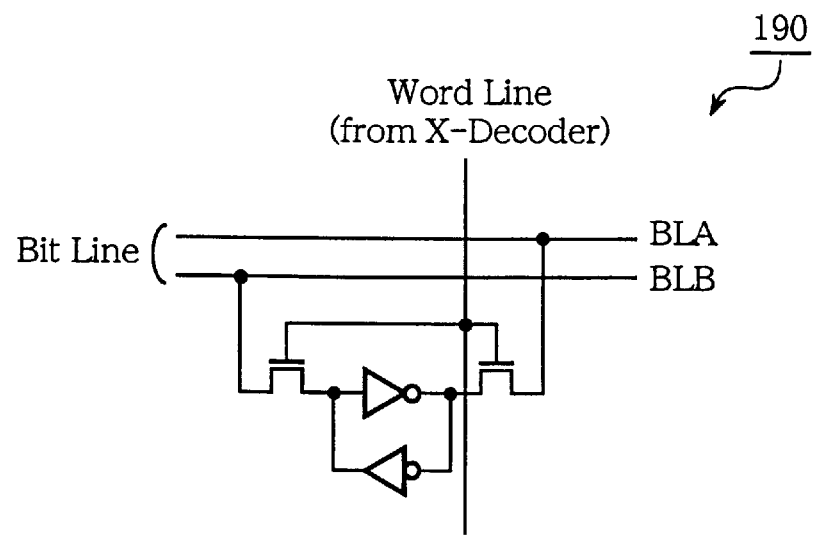
FIG. 22 is a circuit diagram showing a memory cell in a single-port RAM.
Figure 23:
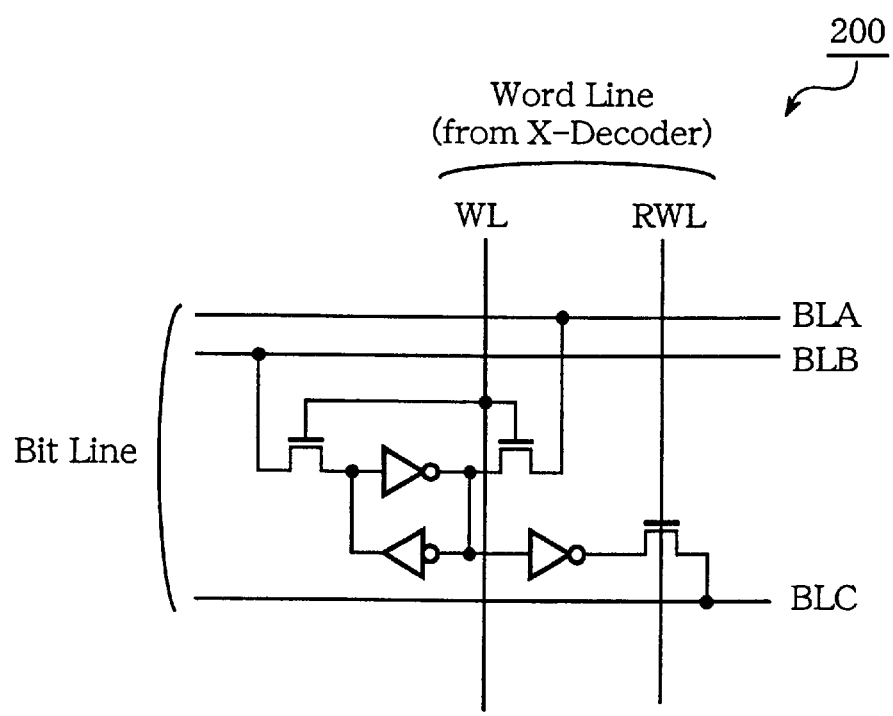
FIG. 23 is a circuit diagram showing a memory cell in a two-port RAM.

FIG. 22 is a circuit diagram showing the configuration of a memory cell of the single-port RAM. In FIG. 22, Reference number 190 designates the single-port RAM. FIG. 23 is a circuit diagram showing the configuration of a memory cell in the two-port RAM. In FIG. 22, Reference number 200 denotes a memory cell in the two-port RAM. In FIGS. 22 and 23, Reference characters BLA and BLB designate complementary bit lines, BLC a read-only bit line, WL a word line, and RWL a read-only word line.

In the memory cell in the two-port-RAM shown in FIG. 23, the complementary bit lines BLA and BLB and the word line WL correspond to the first port, and the read-only bit line BLC and the read-only word line RWL correspond to the second port (for read-only use).

In the eighth embodiment of present invention, a memory circuit with a redundant circuit can logically configured using memory cells of different circuit configurations. The memory cell of the two-port RAM shown in FIG. 23 can also be used to form a single-port RAM. In such an instance, the address decoder needs only to be one-port. For example, the word line WL and the read-only word line RWL in the two-port RAM shown in FIG. 23 may also be connected logically in common.

As described above, according to the eighth embodiment, the RAM is logically equipped with a redundant circuit formed by combining therewith another RAM having memory cells incorporated therein for redundant bits. Accordingly, even after the completion of the layout design, the RAM can be additionally provided to form a semiconductor integrated circuit device logically equipped with a redundant circuit.

As will be appreciated from the above, according to the present invention, the RAM is configured to logically have a redundant circuit by using another RAM to incorporate therein memory cells for redundant bits. Hence, even after the completion of the layout design of the RAM, another RAM as the redundant circuit can be additionally built in the semiconductor integrated circuit device without involving any design changes, by which the semiconductor integrated circuit device can be logically equipped with the redundant circuit. Thus, the present invention enhances the design efficiency and permits reduction of the time for design.

In addition, according to the present invention, a small-sized RAM is used as the redundant circuit. This permits reduction of the size (or the circuit area) of the semiconductor integrated circuit device even if a circuit composed of a comparator and an OR gate is incorporated in the semiconductor integrated circuit device. In other words, the semiconductor integrated circuit device can be formed using a redundant circuit provided with memory cells of a small number of bits, and an increase in the circuit area of the integrated circuit device can be suppressed as compared with the conventional semiconductor integrated circuit devices.

Moreover, since memory cells of a smaller number of bits than in the prior art are added as a redundant circuit in the semiconductor integrated circuit device, it is possible to obtain a semiconductor integrated circuit device of reduced circuit size, and since a failure corresponding to two bit lines can be recovered, it is possible to recover from a short in the bit lines.

Furthermore, according to the present invention, an AND circuit is further added in the semiconductor integrated circuit device, to which the signal TESTB is inputted. Accordingly, by setting the signal TESTB to 0 (TESTB=0), the RAM may enter a write enable state only when both the address to be accessed and the signal FYA<> match. By controlling the write enable signal WE while providing the address to the RAM, it is possible to test both the RAM as a memory circuit and the RAM used as a redundant circuit at the same time.

It will be apparent that many modifications and variations may be effected without departing from the scope of the novel concepts of the present invention.

What is claimed is:

1. A semiconductor integrated circuit device comprising:
   a first memory circuit comprising an address decoder and at least first and second memory cell groups, each memory cell group including memory cells of a number proportional to a number of words, and which outputs first and second data from said first and second memory cell groups;
   a second memory circuit comprising an address decoder and a third memory cell group including memory cells of a number smaller than or equal to the number of words of said first memory circuit and outputs third data from said third memory cell group; and
   a redundancy control circuit comprising a first selector circuit for selecting either one of said first and second data and a second selector circuit for selecting either one of said first data and said third data.

2. The semiconductor integrated circuit device according to claim 1, wherein said third memory cell group in said second memory circuit includes memory cells of a number proportional to the number of words of said first memory circuit.

3. The semiconductor integrated circuit device according to claim 1, wherein the number of words of said first memory circuit is an integral multiple of the number of memory cell group contained in said third memory cells in said second memory circuit.

4. The semiconductor integrated circuit device according to claim 1, further comprises:
   a comparator circuit for comparing said first, second and third data output from said first and second memory circuits with expected values, and for outputting the comparison results; and
   a scan path circuit comprises a plurality of scan flip flops for serially shifting out said comparison results provided from said comparator circuit.

5. The semiconductor integrated circuit device according to claim 1, wherein said first memory circuit is a cell-based RAM and said second memory circuit is a gate-array RAM.

6. The semiconductor integrated circuit device according to claim 1, wherein said memory cells in said first memory circuit are each a memory cell of a single-port RAM, and said memory cells in said second memory circuit are each a memory cells of a multi-port RAM.

7. The semiconductor integrated circuit device according to claim 1, further comprises an output register for storing said first, second and third data outputs from said first memory circuit and said second memory circuit.

* * * * *

UNITED STATES PATENT AND TRADEMARK OFFICE
CERTIFICATE OF CORRECTION

PATENT NO. : 6,229,741 B1
DATED : May 8, 2001
INVENTOR(S) : Hideshi Maeno

It is certified that error appears in the above-identified patent and that said Letters Patent is hereby corrected as shown below:

<u>Title page,</u>
The name of Assignee is corrected to read:

[73] Assignee: Mitsubishi Denki Kabushiki Kaisha
Tokyo (JP)

Signed and Sealed this

Twelfth Day of March, 2002

Attest:

JAMES E. ROGAN
*Director of the United States Patent and Trademark Office*

*Attesting Officer*